(12) United States Patent
Ikeda et al.

(10) Patent No.: US 8,734,914 B2
(45) Date of Patent: *May 27, 2014

(54) FILM FORMATION METHOD AND METHOD FOR MANUFACTURING LIGHT-EMITTING DEVICE

(75) Inventors: Hisao Ikeda, Kanagawa (JP); Takahiro Ibe, Kanagawa (JP); Tomoya Aoyama, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/399,122

(22) Filed: Feb. 17, 2012

(65) Prior Publication Data

US 2012/0148730 A1 Jun. 14, 2012

Related U.S. Application Data

(62) Division of application No. 12/055,970, filed on Mar. 26, 2008, now Pat. No. 8,119,204.

(30) Foreign Application Priority Data

Apr. 27, 2007 (JP) ................... 2007-119512

(51) Int. Cl.
| | | |
|---|---|---|
| *C23C 14/12* | (2006.01) | |
| *C23C 14/00* | (2006.01) | |
| *C23C 14/24* | (2006.01) | |
| *C23C 14/26* | (2006.01) | |
| *C23C 14/04* | (2006.01) | |
| *C23C 16/448* | (2006.01) | |

(52) U.S. Cl.
CPC ............ *C23C 14/12* (2013.01); *C23C 14/00* (2013.01); *B05D 2401/30* (2013.01); *C23C 14/24* (2013.01); *C23C 14/26* (2013.01); *C23C 14/042* (2013.01); *C23C 16/4485* (2013.01)
USPC ................. 427/587; 427/593; 427/255.6

(58) Field of Classification Search
CPC .................................................... B05D 2401/30
See application file for complete search history.

(56) References Cited

U.S. PATENT DOCUMENTS

| 6,165,543 A | 12/2000 | Otsuki et al. |
|---|---|---|
| 6,869,636 B2 | 3/2005 | Chung |

(Continued)

FOREIGN PATENT DOCUMENTS

| JP | 2000-77182 | 3/2000 |
|---|---|---|
| JP | 2003-123970 | 4/2003 |

(Continued)

OTHER PUBLICATIONS

Hwang, C.C., "47.3: Plane Source and In-Line Deposition System for OLED Manufacturing," SID Digest '06: SID International Symposium Digest of Technical Papers, vol. XXXVII, Book II, Jun. 7-9, 2006, pp. 1567-1570.

(Continued)

*Primary Examiner* — Erma Cameron
(74) *Attorney, Agent, or Firm* — Husch Blackwell LLP

(57) ABSTRACT

A binder material layer including an evaporation material is formed over a main surface of an evaporation source substrate, a substrate on which a film is formed is placed so that the binder material layer and a main surface thereof face each other, and heat treatment is performed on a rear surface of the evaporation source substrate so that the evaporation material in the binder material layer is heated to be subjected to sublimation or the like, whereby a layer of the evaporation material is formed on the substrate on which a film is formed. When a low molecular material is used for the evaporation material and a high molecular material is used for the binder material, the viscosity can be easily adjusted, and thus, film formation is possible with higher throughput than conventional film formation.

16 Claims, 14 Drawing Sheets

(56) References Cited

U.S. PATENT DOCUMENTS

| | | | |
|---|---|---|---|
| 7,052,784 B2 | 5/2006 | Chin et al. | |
| 7,723,735 B2 | 5/2010 | Matsuda | |
| 7,875,308 B2 | 1/2011 | Chin et al. | |
| 2001/0004469 A1 | 6/2001 | Himeshima et al. | |
| 2005/0095459 A1 | 5/2005 | Chin et al. | |
| 2005/0170075 A1* | 8/2005 | Chung | 427/66 |
| 2005/0266152 A1 | 12/2005 | Nguyen et al. | |
| 2005/0281948 A1* | 12/2005 | Grace et al. | 427/248.1 |
| 2006/0273713 A1 | 12/2006 | Mehta et al. | |
| 2007/0126966 A1* | 6/2007 | Takahashi | 349/130 |

FOREIGN PATENT DOCUMENTS

| | | |
|---|---|---|
| JP | 2004-39630 | 2/2004 |
| JP | 2005-26121 | 1/2005 |
| JP | 2006-012552 A | 1/2006 |
| JP | 2006-324233 | 11/2006 |
| KR | 2004-0001381 A | 1/2004 |

OTHER PUBLICATIONS

Koren Office Action re Application No. KR 2008-0029454, dated Feb. 18, 2014.

* cited by examiner

FIG. 10A
FIG. 10C
FIG. 10B
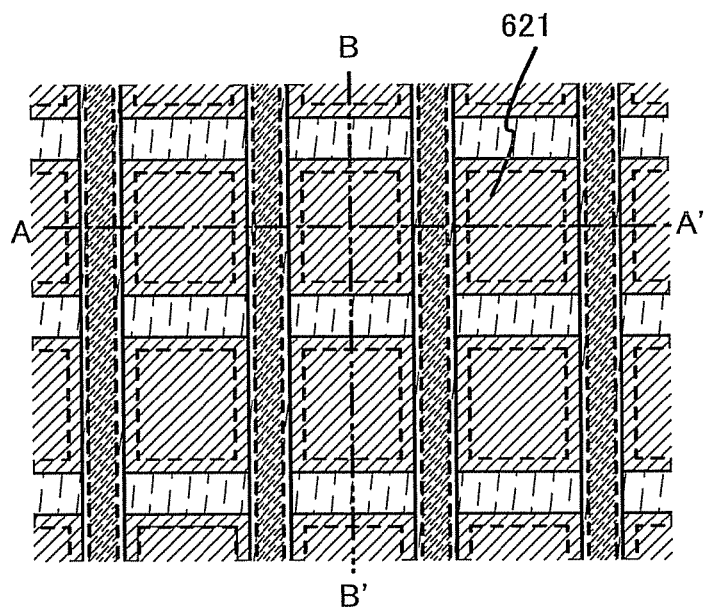
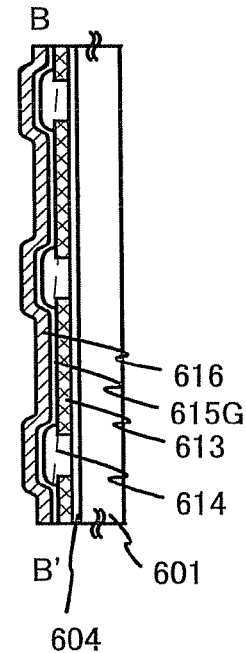
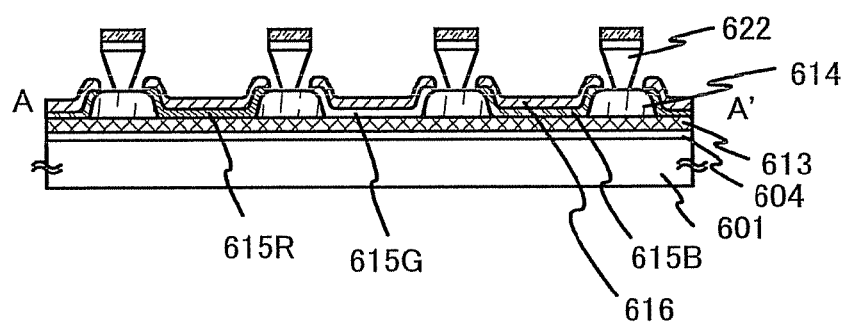

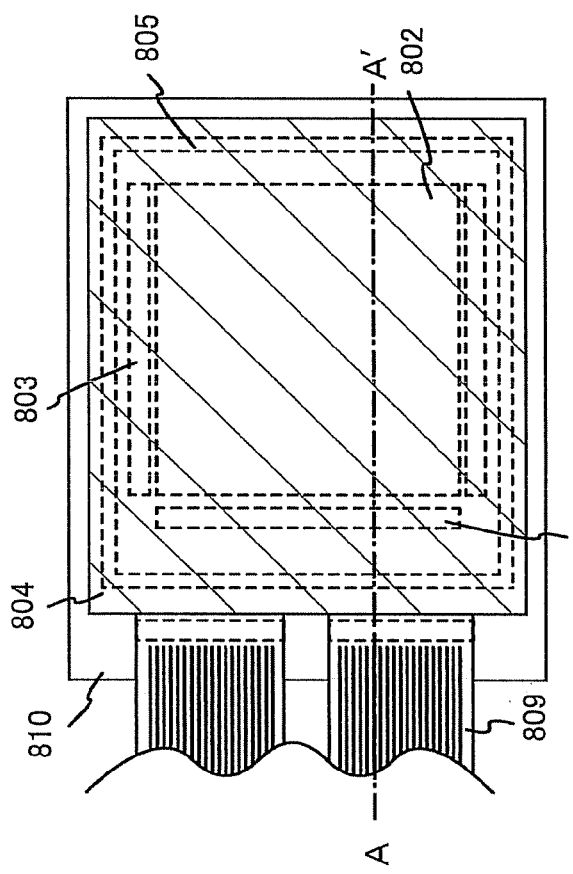
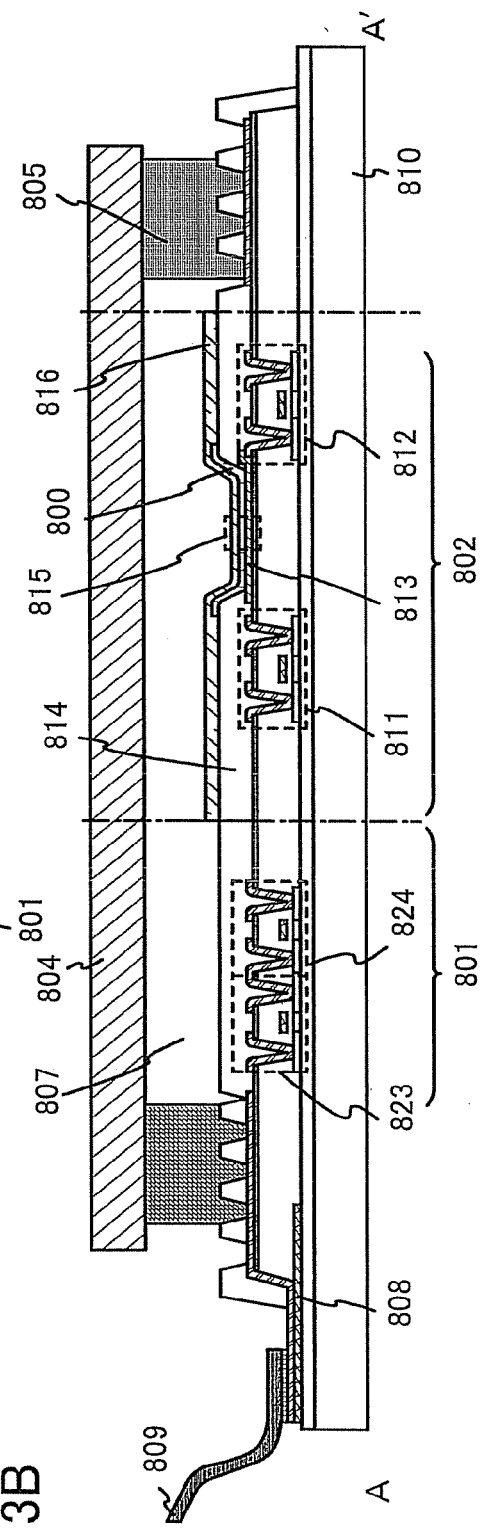
FIG. 13A
FIG. 13B

FILM FORMATION METHOD AND METHOD FOR MANUFACTURING LIGHT-EMITTING DEVICE

This application is a divisional of U.S. application Ser. No. 12/055,970 filed on Mar. 26, 2008, which issued as U.S. Pat. No. 8,119,204 on Feb. 21, 2012.

BACKGROUND OF THE INVENTION

1. Field of the Invention

The present invention relates to a film formation method by which a film is formed over a substrate. Further, the present invention relates to a method for manufacturing a light-emitting device in which a layer including an organic compound which is manufactured by the film formation method is used as a light-emitting layer.

2. Description of the Related Art

In recent years, a technique relating to a flat panel display has been remarkably progressed. As a typical flat panel display, a liquid crystal display device and a light-emitting device can be given.

A liquid crystal display device operates by control of transmittance of light, which is emitted from a backlight, at each pixel by liquid crystal elements arranged in matrix. A light-emitting device operates by control of a lighting state or a non-lighting state of self-light-emitting elements arranged in matrix at each pixel. As compared to a liquid crystal display device, a light-emitting device has many merits. Since a light-emitting element provided in a light-emitting device emits light by itself, visibility is high and backlight is not necessary, which is suitable for thinning, and a viewing angle is not limited. Further, since utilization efficiency of light is high, a light-emitting element consumes low power, and response speed is high. Accordingly, a light-emitting device using a light-emitting element has attracted attention as an alternative to a display device or a liquid crystal display device which uses a cathode-ray tube. A light-emitting device having such merits is mounted on an electronic device such as a mobile phone or a digital still camera, and has been gradually put into practical use.

Light-emitting devices can be roughly classified into passive-matrix (simple-matrix) light-emitting devices and active-matrix light-emitting devices. Since a supply of current to a light-emitting element can be maintained to some extent even after a video signal is input, active-matrix light-emitting devices can be flexibly adapted to enlargement and high definition of a panel, and are becoming the mainstream. Pixels have various structures in active-matrix light-emitting devices. Each of the structures is distinctively and technically devised, in which at least a thin film transistor (hereinafter referred to as a TFT) which controls input of a video signal to a light-emitting element and a TFT for applying current to the light-emitting element are provided in each pixel.

It is considered that a light-emitting element has a mechanism in which, when voltage is applied between a pair of electrodes which interpose a layer including an organic compound, electrons injected from a cathode and holes injected from an anode are recombined in an emission center of the layer including an organic compound to form a molecular exciton, and energy is released to emit light when the molecular exciton returns to the ground state. As excited states, a singlet excited state and a triplet excited state are known, and light emission is considered to be possible through either of these excited states.

The layer including an organic compound typically has a stacked structure of "a hole transporting layer, a light-emitting layer, and an electron transporting layer". Further, EL (electro luminescence) materials which form the layer including an organic compound are roughly classified into low molecular (monomer) materials and high molecular (polymer) materials. Films of high molecular materials are mainly formed by a spin coating method, a printing method, an ink-jet method, or the like which is a wet film formation method, whereas films of low molecular materials are mainly formed by a vacuum evaporation method which is a dry film formation method. Since low molecular materials are easily purified, impurities are not easily mixed. Therefore, when low molecular EL materials are used, a highly-reliable light-emitting device with long life can be manufactured.

However, when films of low molecular materials are formed by a vacuum evaporation method, the following become obstacles to reduction of the manufacturing cost of a light-emitting device: utilization efficiency of EL materials is about 1% or less, which is extremely low, and EL materials are extremely expensive. Thus, a technique which improves utilization efficiency of low molecular materials has attracted enormous attention. As such a technique, Reference 1 (Changhun Chriss Hwang, Plane Source and In-line Deposition System for OLED Manufacturing, SID 06 DIGEST, pp. 1567-1570) can be given, for example.

SUMMARY OF THE INVENTION

It is an object of the present invention to provide a film formation method excellent in throughput, in which a film which is uniform in film thickness and film quality is formed while the manufacturing cost is suppressed by improvement of utilization efficiency of a material, in forming a film. In particular, it is another object of the present invention to obtain uniformity of film formation in which variation in film thickness is in the range of less than 3%.

A conventional evaporation apparatus used for deposition of a layer including an organic compound includes a rotatable substrate holder, a crucible (or an evaporation boat) within which an EL material to be evaporated is sealed, a shutter to prevent the rising of an evaporating or sublimating EL material, and a heater to heat the EL material in the crucible. Deposition of the EL material by evaporation is performed in vacuum (in many cases, in high vacuum). First, a substrate is set on the substrate holder, and the EL material is heated by the heater to be evaporated or sublimated, whereby the EL material is deposited on a rotating substrate. At this time, in order to deposit uniformly, a long distance is needed between the substrate and the crucible. Even in the case of using a glass substrate having the size of 300 mm×360 mm for the first generation, a distance of 1 m or more is necessary between the substrate and the crucible, and it is necessary that a distance between the substrate and the crucible be further increased as the size of the substrate is increased. When the distance between the substrate and the crucible is increased in such a manner, the speed of deposition decreases. Further, since a film formation chamber is enlarged, there is a problem in that time required for evacuation of a film formation chamber is increased.

Furthermore, in a method for depositing a layer including an organic compound with the use of the conventional evaporation apparatus, most of the EL materials that evaporate or sublimate adhere to an inner wall, the shutter, or a contamination shield which are in a film formation chamber of the evaporation apparatus. Here, a contamination shield is a protective plate for preventing an evaporation material from adhering to an inner wall of a film formation chamber. Accordingly, it is necessary to regularly perform maintenance such as cleaning to remove an EL material adhering to the inner wall, the shutter, or the contamination shield in the film formation chamber. In such maintenance, suspension of part of a manufacturing line is necessary, which results in reduction of manufacturing efficiency.

Moreover, in the method for depositing a layer including an organic compound with the use of the conventional evaporation apparatus, deposition is not performed immediately after the evaporation material starts evaporating or sublimating; in order to obtain a film which is uniform in thickness, evaporation on a substrate is initiated by opening of the shutter after the evaporation speed is stabilized. Here, whether or not the evaporation speed is stabilized is judged by measurement using a film thickness monitor. Thus, there are loss of time taken until the evaporation speed is stabilized and loss of the evaporation material, which results in reduction of manufacturing efficiency.

Further, in the method for depositing a layer including an organic compound with the use of the conventional evaporation apparatus, there is a problem in that a thickness of a deposited film in the center portion of the substrate is different from that in the peripheral portion of the substrate because a distance between an evaporation source and the center portion of the substrate is different from a distance between the evaporation source and the peripheral portion of the substrate. This problem is significant as a distance between the substrate and the evaporation source (crucible) is further increased and the size of the substrate is further increased.

Furthermore, in the method for depositing a layer including an organic compound with the use of the conventional evaporation apparatus, a substrate is rotated; therefore, it is not suitable for processing a large-area substrate.

In the conventional evaporation apparatus used for depositing a layer including an organic compound, a film formation chamber is enlarged. Accordingly, in the case of depositing a stack of EL layers with the use of one chamber as a film formation chamber, when a second EL layer is deposited after a first EL layer is formed, there is a concern that a material of the first EL layer may be mixed into the second EL layer.

It is another object of the present invention to reduce process time of a substrate and to improve utilization efficiency of an evaporation material with a manufacturing cost reduced, in deposition of a layer including an organic compound, and to solve a problem that a material is mixed in deposition by stacking layers each including an organic compound.

Further, it is another object of the present invention to form a film which is uniform in film thickness and film quality also in the case of using a large-area substrate. For example, as the size of a substrate to which the present invention is applied, 320 mm×400 mm, 370 mm×470 mm, 550 mm×650 mm, 600 mm×720 mm, 680 mm×880 mm, 1,000 mm×1,200 mm, 1,100 mm×1,250 mm, 1,150 mm×1,300 mm, 1,500 mm×1,800 mm, 1,900 mm×2,200 mm, 2,160 mm×2,460 mm, 2,400 mm×2,800 mm, 2,850 mm×3,050 mm, or the like may be used.

Moreover, it is another object of the present invention to provide a method for manufacturing a light-emitting device.

One aspect of the present invention is a film formation method including the steps of forming a mixture of an evaporation material and a material of higher molecular weight than the evaporation material, placing a substrate so that the mixture and a main surface thereof face each other, and performing heat treatment on the mixture, whereby a layer including the evaporation material is formed on a surface of the substrate.

In this specification, "molecular weight" in "a material of higher molecular weight than an evaporation material" denotes molecular weight which is obtained after film formation. Molecular weight can be measured by, for example, time-of-flight mass spectrometry method.

Another aspect of the present invention is a film formation method including the steps of forming a binder material layer including an evaporation material over a main surface of a first substrate, placing a second substrate so that the binder material layer and a main surface thereof face each other, and performing heat treatment on a rear surface of the main surface of the first substrate, whereby the evaporation material in the binder material layer is evaporated or sublimated and an evaporation material layer is formed on the second substrate. It is to be noted that the area heated in one film formation process is almost the same as the area of the first substrate.

In film formation of the evaporation material, the evaporation material does not necessarily undergo a liquid state or a gas state, and the evaporation material may be formed in a solid state. Therefore, in film formation, the evaporation material is not necessarily evaporated or sublimated. In this specification, the case where the evaporation material evaporates or sublimates or the case where the evaporation material is evaporated or sublimated includes the case where a film is formed in such a solid state.

Another aspect of the present invention is a film formation method including the steps of selectively forming a binder material layer including an evaporation material over a main surface of a first substrate, placing a second substrate so that the binder material layer and a main surface thereof face each other, and performing heat treatment on a rear surface of the main surface of the first substrate, whereby the evaporation material in the binder material layer is evaporated or sublimated and an evaporation material layer is selectively formed on the second substrate. It is to be noted that the area heated in one film formation process is almost the same as the area of the first substrate.

Another aspect of the present invention is a film formation method including the steps of selectively forming a thermally conductive layer over a main surface of a first substrate, forming a binder material layer including an evaporation material over the thermally conductive layer, placing a main surface of a second substrate so as to face the main surface of the first substrate, and performing heat treatment on a rear surface of the main surface of the first substrate, whereby the evaporation material in the binder material layer evaporates or sublimates and a material layer of the evaporation material is selectively formed on the second substrate. It is to be noted that the area heated in one film formation process is almost the same as the area of the first substrate.

Another aspect of the present invention is a film formation method including the steps of forming a binder material layer including an evaporation material over a main surface of a first substrate, placing a second substrate so that the binder material layer and a main surface thereof face each other, placing a mask provided with an opening having a desired pattern between the first substrate and the second substrate, and performing heat treatment on a rear surface of the first substrate, whereby the evaporation material in the binder material layer is evaporated or sublimated and an evaporation material layer is selectively formed on the second substrate. It is to be noted that the area heated in one film formation process is almost the same as the area of the first substrate.

In the present invention having the above-described structure, a main surface of the first substrate may face that of the second substrate, and angles of these substrates with respect to horizontal planes are not particularly limited. Therefore, a film formation apparatus used in the present invention may be a face-up film formation apparatus or a face-down film formation apparatus; however, a film formation apparatus employing vertical placement of a substrate is preferably used. A system of vertical placement of a substrate is a system in which a main surface of a first substrate and a main surface of a second substrate placed to face that of the first substrate are placed to be almost perpendicular to horizontal planes. Here, "being almost perpendicular" indicates an angle greater than or equal to 70° and less than or equal to 110°.

In the present invention having the above-described structure, a surface of a mixture layer of the evaporation material and the binder material and a surface (a surface on which a film is formed) of the second substrate which is a substrate on which a film is formed are preferably placed to be parallel to each other.

In a film formation apparatus used for the present invention, a distance d which refers to a distance between a surface of the mixture layer of the evaporation material and the binder material, which is provided over a surface of the first substrate, and a surface (a surface on which a film is formed) of the second substrate which is a substrate on which a film is formed is preferably greater than or equal to 0 mm and less than or equal to 100 mm, more preferably greater than or equal to 0 mm and less than or equal to 10 mm.

It is to be noted that a distance d is defined as a distance between a surface of the mixture layer of the evaporation material and the binder material over the first substrate and a surface of the second substrate. However, in the case where a certain kind of film (for example, a conductive film serving as an electrode, a partition wall, or the like) is formed on the second substrate and thus the surface of the second substrate has unevenness, the distance d is defined as a distance between the surface of the mixture layer of the evaporation material and the binder material over the first substrate, and a topmost surface of a layer formed on the second substrate, that is, a surface of the film (the conductive film, the partition wall, or the like).

In the present invention having the above-described structure, the heat treatment is performed by a method in which a heat source is made to approach the first substrate or a method in which the first substrate is irradiated with light by a lamp.

In the present invention having the above-described structure, the temperature of the heat treatment is preferably set as high as possible so as to exceed the evaporation temperature or sublimation temperature of the evaporation material but does not exceed 50° C. more than the evaporation temperature or sublimation temperature of the evaporation material. When the heat treatment is performed at a temperature which exceeds the evaporation temperature or sublimation temperature of the evaporation material, the evaporation material can be evaporated or sublimated. Further, when the temperature of the heat treatment is set to a temperature which does not exceed 50° C. more than the evaporation temperature or sublimation temperature of the evaporation material, the evaporation material can be evaporated without decomposition even when the evaporation material is a material which is easily decomposed by heating. If the temperature of the heat treatment exceeds 50° C. more than the evaporation temperature or sublimation temperature of the evaporation material, the evaporation material may be decomposed. Further, the temperature of the heat treatment may be set low to satisfy the above-described temperature range in order to relieve an effect of heat radiation of the heat source depending on a distance between the first substrate and the second substrate or a material and the thickness of the second substrate which is a substrate on which a film is formed. Here, the temperature of the heat treatment is measured at the surface of the first substrate.

In the case where the evaporation material is a mixture of two or more kinds of substances, heat treatment is preferably performed at a temperature greater than or equal to the highest evaporation temperature or sublimation temperature of a plurality of evaporation temperatures or sublimation temperatures. In this case, the temperature of the heat treatment is preferably set high so as to exceed the highest evaporation temperature or sublimation temperature but does not exceed 50° C. more than the highest evaporation temperature or sublimation temperature. However, the temperature of the heat treatment may be set low (greater than or equal to the evaporation temperature or sublimation temperature of a substance with the highest evaporation temperature or sublimation temperature) in consideration of the decomposition temperature (including the evaporation temperature or the sublimation temperature) of an evaporation material, with a lower evaporation temperature or a lower sublimation temperature, a distance from the substrate on which a film is formed, and a material and the thickness of the substrate on which a film is formed.

In the present invention having the above-described structure, one of or both the first substrate and the second substrate may be cooled as needed. Cooling the substrate as needed makes it possible to use a flexible substrate such as a plastic substrate. Further, materials with different evaporation temperatures or sublimation temperatures can be used as an evaporation material. A cooling unit may be provided in a film formation apparatus which is used so as to cool the substrates.

The present invention having the above-described structure is preferably implemented in a vacuum film formation chamber. More specifically, the present invention is preferably implemented in a film formation chamber with the pressure less than or equal to 0.665 Pa, more preferably in a film formation chamber with the pressure greater than or equal to $10^{-6}$ Pa and less than or equal to $10^{-4}$ Pa. As a vacuum evacuation unit provided to be connected to the film formation chamber, an oil-free dry pump is used to evacuate the pressure of from the atmosphere to approximately 1 Pa, and in order to further increase the degree of vacuum, a magnetic levitation turbo molecular pump or a complex molecule pump is preferably used to evacuate the pressure. A cryopump may be provided together in the film formation chamber in order to remove moisture. An inner wall surface of the film formation chamber is preferably subjected to mirror surface treatment by electrochemical polishing to reduce its surface area, so that the discharge of gas is reduced.

As the first substrate in the present invention having the above-described structure, an oxide substrate of quartz, ceramic, sapphire, or the like, or a conductive substrate formed from gold, platinum, copper, silver, tungsten, tantalum, titanium, or aluminum, or an alloy material of any of these may be used. Alternatively, a substrate in which any of the above-described conductive materials is formed over an oxide substrate, or the like, may be used. Further alternatively, a conductive substrate in which a semiconductor material such as silicon or germanium is formed may be used. Still further alternatively, a light-transmitting substrate (a glass substrate, a quartz substrate, a plastic substrate including an inorganic material, or the like) over which an amorphous silicon film or a microcrystalline silicon film is formed may be used as the first substrate.

As a method for forming the mixture layer of the evaporation material and the binder material over the first substrate, an evaporation method, a sputtering method, a spin coating method, a printing method, a droplet discharge method (an ink-jet method), a spray method, a dripping method, a dispenser method, or the like is used. It is to be noted that a droplet discharge method includes an ejection method.

In the present invention having the above-described structure, the mixture layer is formed from the evaporation material and a substance of higher molecular weight than the evaporation material. Preferably, a low molecular material is used for the evaporation material, and a high molecular material is used for the binder material.

In the present invention having the above-described structure, the binder material which forms the binder material layer is not limited to a specific material as long as it can be formed by a wet process. The binder material may be, for example, acrylic, polyimide, or the like, or a high molecular EL material. As the high molecular EL material, for example, poly(N-vinylcarbazole) (PVK) and poly(p-phenylenevinylene) (PPV) can be given.

In the present invention having the above-described structure, as the evaporation material, the following can be used: copper phthalocyanine (CuPc), 4,4'-[N-(1-naphthyl)-N-phenylamino]biphenyl (NPB), N,N'-bis(3-methylphenyl)-N,N'-diphenyl-[1,1'-biphenyl]-4,4'-diamine (TPD), 4,4'-bis(N-{4-[N'-(3-methylphenyl)-N'-phenylamino]phenyl}-N-phenylamino)biphenyl (DNTPD), tris(8-quinolinolato) aluminum (abbreviation: Alq), tris(4-methyl-8-quinolinolato)aluminum (abbreviation: Almq$_3$), bis(2-methyl-8-quinolinolato)(4-phenylphenolate)aluminum (abbreviation: BAlq), 4,4'-di(N-carbazolyl)biphenyl (abbreviation: CBP), 2-tert-butyl-9,10-di(2-naphthyl)anthracene (abbreviation: t-BuDNA), 4,4'-bis(2,2-diphenylvinyl)biphenyl (abbreviation: DPVBi), bathophenanthroline (abbreviation: BPhen), bathocuproine (abbreviation: BCP), 3-(2-benzothiazole)-7-(diethylamino)coumarin, or 3-(2-benzothiazolyl)-7-(diethylamino)coumarin (abbreviation: coumarin 6).

In the present invention having the above-described structure, co-evaporation can also be performed using two or more kinds of evaporation materials. It is to be noted that co-evaporation means an evaporation method in which a plurality of different substances is concurrently evaporated or sublimated from different evaporation sources.

Further, a mask provided with an opening having a desired pattern may be placed between the first substrate over which the mixture layer of the evaporation material and the binder material is formed, and the second substrate which is the substrate on which a film is formed. When such a mask is used, film formation can be selectively performed. In particular, in the present invention, a distance between the mixture layer of the evaporation material and the binder material provided over the first substrate and the second substrate which is the substrate on which a film is formed is short. Accordingly, expansion in the evaporation direction is suppressed, and thus, evaporation involving an unwanted material entering through the mask can be prevented. "The evaporation involving an unwanted material entering through a mask" refers to that a film formation region of a substrate on which a film is formed is larger than an opening region of a mask.

In the first substrate provided with the mixture layer of the evaporation material and the binder material, a conductive material layer formed over a conductive substrate or a conductive material layer formed over an oxide substrate may be selectively removed, so that a pattern of either of these material layers may be formed.

In the present invention, it is preferable that heat be uniformly applied to a large area of the substrate and one substrate be heated by one application of heat for film formation process. Further, the area of the first substrate can be enlarged. In the case where the area of the first substrate is enlarged, an area to be heated is expanded depending on that.

Another aspect of the present invention is a method for manufacturing a light-emitting device including the steps of forming a mixture layer of an EL material and a material of higher molecular weight than the EL material over a main surface of a first substrate, placing a second substrate having a first electrode so as to face the mixture layer, evaporating or sublimating the EL material by heating the other surface of the first substrate, forming an EL material layer over the first electrode, and forming a second electrode over the EL material layer.

The present invention can be applied to formation of various films. For example, a film formation method of the present invention may be applied to formation of pentacene which is to be an active layer in an organic transistor in manufacturing an organic transistor.

By using the present invention, a distance between an evaporation source and a substrate on which a film is formed can be reduced. Therefore, in forming a film, a material can be prevented from being scattered, utilization efficiency of a material can be drastically improved, and an interval of maintenance can be lengthened. Further, the speed of film formation is improved, whereby consumption of the material and process time can be suppressed. Accordingly, throughput can be improved and cost can be reduced.

By using the present invention, even in the case of using a large-area substrate, a distance between the center portion of the substrate and an evaporation source is almost equal to a distance between the peripheral portion of the substrate and the evaporation source. Accordingly, the thickness and film quality of a film which is formed can be made uniform.

Further, by using the present invention, it is not necessary to manufacture an evaporation source in vacuum even when an evaporation material is a low molecular material, and the evaporation source can be manufactured even in the atmospheric air.

BRIEF DESCRIPTION OF THE DRAWINGS

In the accompanying drawings:

FIGS. 10A to 10C are a top view and cross-sectional views of a passive-matrix light-emitting device to which the present invention is applied;

FIGS. 13A and 13B are a top view and a cross-sectional view, respectively, of an active-matrix light-emitting device to which the present invention is applied.

DETAILED DESCRIPTION OF THE INVENTION

Embodiment Mode

Figure 1A:
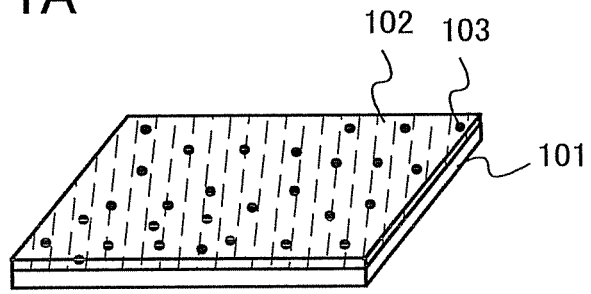
FIGS. 1A to 1C are perspective views illustrating a film formation method of the present invention.

Embodiment Modes and embodiments of the present invention will be described below with reference to the accompanying drawings. However, the present invention is not limited to the description given below, since it will be readily apparent to those skilled in the art that various changes and modifications in modes and details thereof can be made without departing from the purpose and scope of the present invention. Therefore, the present invention should not be interpreted as being limited to the description of the embodiment modes and embodiments given below. It is to be noted that in describing structures of the present invention with reference to the drawings, like reference numerals are used for like portions throughout the drawings.

Embodiment Mode 1

Figure 1B:
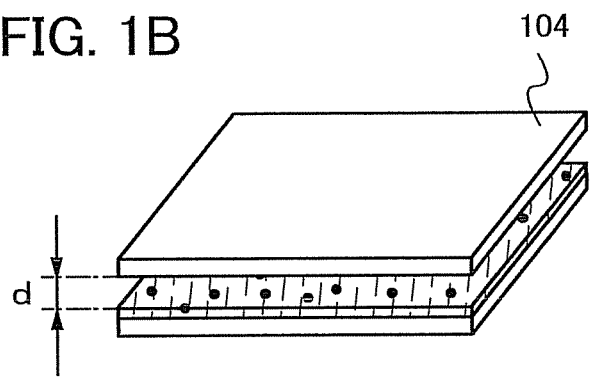
Figure 1C:
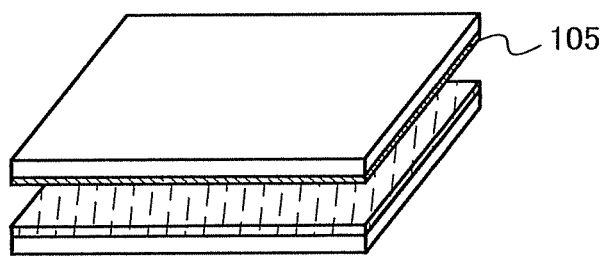

One mode of a film formation method of the present invention is described with reference to the drawings. FIGS. 1A to 1C are perspective views showing a concept of a film formation method of this embodiment mode.

First, a first material layer 102 including an evaporation material 103 is formed over a main surface of a first substrate 101 (see FIG. 1A). Here, the first substrate 101 is an evaporation source substrate, and the first material layer 102 is a layer including a mixture of the evaporation material 103 and a binder material. The binder material is a substance of higher molecular weight than the evaporation material 103.

Next, a second substrate 104 is placed so as to face the first substrate 101 (see FIG. 1B). Here, the second substrate 104 is a substrate on which a film is formed. The second substrate 104 is placed to face the first material layer 102 formed over the first substrate 101. A surface of the first material layer 102 and a surface of the second substrate 104 are placed to have a distance d therebetween. Here, the distance d is preferably greater than or equal to 0 mm and less than or equal to 100 mm, more preferably greater than or equal to 0 mm and less than or equal to 10 mm.

It is to be noted that the distance d is defined as a distance between a surface of a binder material layer including the evaporation material over the first substrate and the surface of the second substrate. However, in the case where a certain kind of film (for example, a conductive film serving as an electrode, a partition wall, or the like) is formed on the second substrate and thus the surface of the second substrate has unevenness, the distance d is defined as a distance between the surface of the binder material layer including the evaporation material over the first substrate and a topmost surface of a layer formed on the second substrate, that is, a surface of the film (the conductive film, the partition wall, or the like).

The surface of the first material layer 102 and the surface (a surface on which a film is formed) of the second substrate 104, which is a substrate on which a film is formed, are preferably placed so as to be parallel to each other. When the first substrate 101 is flat and the first material layer 102 has a uniform film thickness, the first substrate 101 which is an evaporation source substrate and the second substrate 104 which is a substrate on which a film is formed may be placed so as to be parallel to each other.

One main surface of the first substrate 101 may face that of the second substrate 104, and angles of these substrates with respect to a horizontal plane are not particularly limited. That is, a film formation apparatus used in the present invention may be a face-down film formation apparatus, a face-up film formation apparatus, or a film formation apparatus employing vertical placement of a substrate.

Figure 2A:
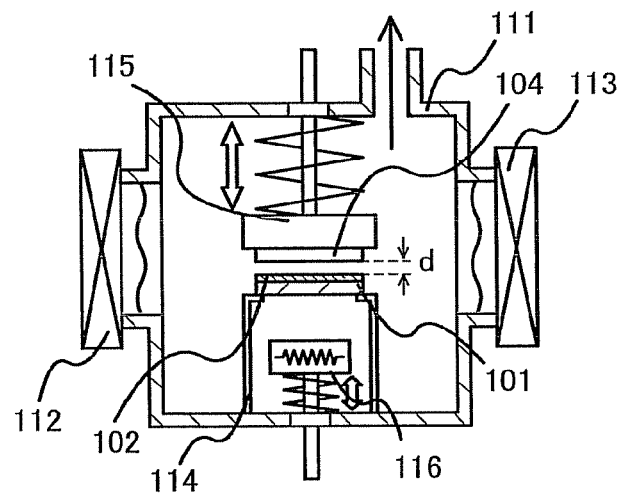
FIGS. 2A to 2C are views illustrating a film formation apparatus used for a film formation method of the present invention.
Figure 2B:
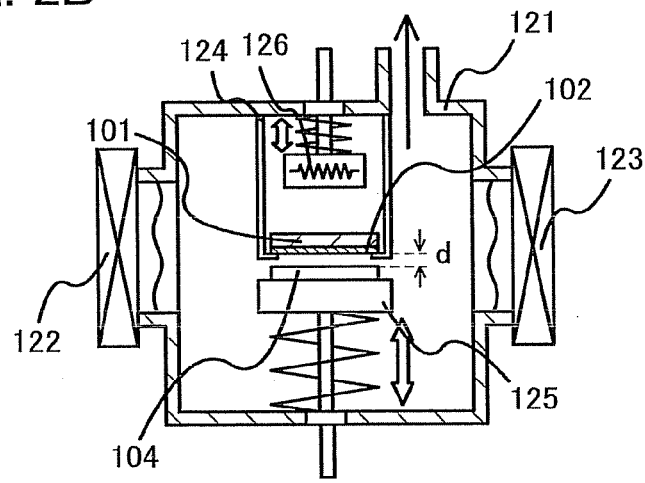
Figure 2C:
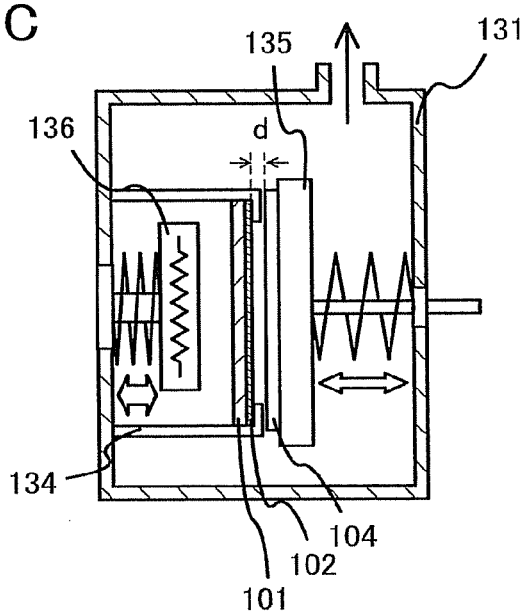
Figure 3A:
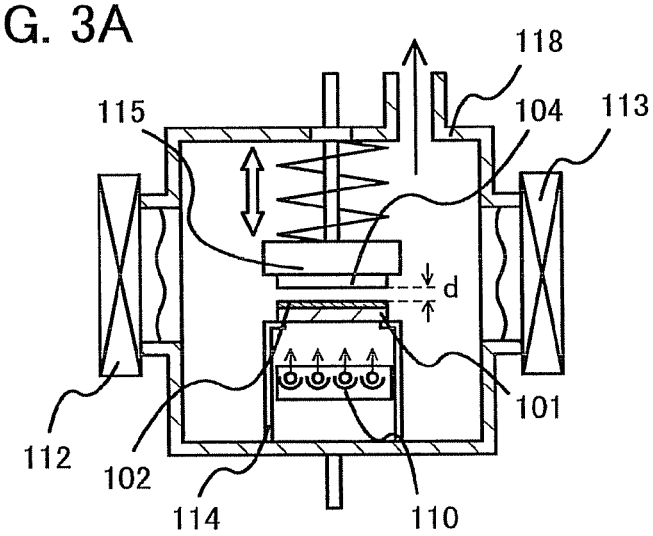
FIGS. 3A to 3C are views illustrating a film formation apparatus used for a film formation method of the present invention.

A face-down system is a system in which a surface on which a film is formed, which is a main surface of a substrate on which a film is formed, is placed so as to face downward with respect to a horizontal plane (see FIGS. 2A and 3A). A face-up system is a system in which a surface on which a film is formed, which is a main surface of a substrate on which a film is formed, is placed so as to face upward with respect to a horizontal plane, in a reverse manner to a face-down system (see FIGS. 2B and 3B). A system of vertical placement of a substrate is a system in which a main surface of an evaporation source substrate and a main surface of a substrate on which a film is formed, which is placed so as to face that of the evaporation source substrate, are placed to be almost perpendicular to horizontal planes (see FIGS. 2C and 3C). Here, "being almost perpendicular" indicates an angle greater than or equal to 70° and less than or equal to 110°.

In a face-up system, a substrate on which a film is formed is mounted on a flat stage or supported by a plurality of pins; therefore, a warp of the substrate mainly due to the self weight of the substrate can be reduced or prevented. Accordingly, variation in film thickness in the center portion and the peripheral portion of the substrate can be reduced or prevented, and thus, a uniform film thickness can be obtained over an entire surface of the substrate.

In a system of vertical placement of a substrate, a substrate on which a film is formed is placed to be perpendicular to a horizontal plane. The self weight of the substrate acts in an in-plane direction of a main surface, so that a warp of the substrate mainly due to the self weight of the substrate can be reduced or prevented. Accordingly, variation in film thickness in the center portion and the peripheral portion of the substrate can be reduced or prevented, and thus, a uniform film thickness can be obtained over an entire surface of the substrate.

Therefore, it is preferable that the present invention employ a face-up system or a system of vertical placement of a substrate.

In FIG. 2B or 2C, a substrate supporting unit 124 or a substrate supporting unit 134 supports the first substrate 101. The substrate supporting unit 124 and the substrate supporting unit 134 are in contact with their respective first material layers 102; however, the present invention is not limited thereto. A portion of the first material layer 102 which is in contact with the substrate supporting unit 124 or the substrate supporting unit 134 is preferably removed. The first material layer 102 may be removed in an etching step such as dry etching (for example, etching using $O_2$ plasma) or wet etching, or by wiping with the use of an organic solvent. Further, in the case where a spin-coating method is used for formation of the first material layer 102, the first material layer 102 may adhere to a rear surface, a side surface, or the like of the first substrate 101, and thus, it is preferably removed together by being wiped in this step.

Then, the first substrate 101 is subjected to heat treatment to evaporate or sublimate the evaporation material 103 from the first material layer 102 provided over a main surface of the first substrate 101. From the evaporated or sublimated evaporation material 103, a second material layer 105 is formed on the second substrate 104 (see FIG. 1C). The heat treatment is performed so that an entire surface of the first substrate 101 is heated. The second material layer 105 is formed to be thinner than the first material layer 102.

In the present invention having the above-described structure, the temperature of the heat treatment is preferably set as high as possible so as to exceed the evaporation temperature or sublimation temperature of the evaporation material but does not exceed 50° C. more than the evaporation temperature or sublimation temperature of the evaporation material. Further, the temperature of the heat treatment may be set low to satisfy the above-described temperature range in order to relieve an effect of heat radiation of the heat source depending on a distance between the first substrate and the second substrate or a material and the thickness of the second substrate which is a substrate on which a film is formed.

In the case where the evaporation material is a mixture of two or more kinds of substances, heat treatment is preferably performed at a temperature greater than or equal to the highest evaporation temperature or sublimation temperature of evaporation temperatures or sublimation temperatures of a plurality of substances. In this case, the temperature of the heat treatment is preferably set high so as to exceed the evaporation temperature or sublimation temperature of a substance with the highest evaporation temperature or sublimation temperature but does not exceed 50° C. more than the evaporation temperature or sublimation temperature of the substance with the highest evaporation temperature or sublimation temperature. However, the temperature of the heat treatment may be set low (greater than or equal to the evaporation temperature or sublimation temperature of the substance with the highest evaporation temperature or sublimation temperature) to satisfy the above-described temperature range in consideration of the decomposition temperature (including the evaporation temperature or the sublimation temperature) of a substance with a lower evaporation temperature or a lower sublimation temperature, a distance from the substrate on which a film is formed, and a material and the thickness of the substrate on which a film is formed.

The heat treatment is performed by a method in which a heat source is made to approach the first substrate 101 or a method in which the first substrate 101 is irradiated with light by a lamp. These methods are described below.

First, the case is described where a heat source is made to approach a rear surface of the first substrate 101 to perform heat treatment. Here, a rear surface of the first substrate 101 refers to a main surface of the first substrate 101, on which the first material layer 102 is not formed. In this case, an area of contact between the heat source and the first substrate 101 is preferably increased so that the first substrate 101 is uniformly heated. The heat source is basically set to become constant at a predetermined temperature. However, the temperature may be controlled so that the temperature is raised or lowered in the range in which the tact time is not affected.

When the heat source is made to approach the first substrate 101, the first material layer 102 over the first substrate 101 can be heated by direct thermal conduction to be evaporated or sublimated in a short time. Thus, an evaporation material is formed on a surface on which a film is formed, which is a main surface of the second substrate 104 placed to face the first material layer 102, so that the second material layer 105 is formed. At this time, film thickness uniformity of the second material layer 105 can be set to less than 3%. When the first material layer 102 has a uniform film thickness and the evaporation material 103 is uniformly dispersed in the first material layer 102, the second material layer 105 can be formed to be uniform in thickness and film quality without using a film thickness monitor.

Further, in a conventional film formation method, since a substrate on which a film is formed is rotated during film formation, the substrate may be damaged due to the rotation. However, in the present invention, since the second substrate 104 which is a substrate on which a film is formed is not rotated, there is an advantage that yield does not decrease even in the case of using a substrate which is sensitive to damage, such as a glass substrate, as the second substrate 104.

Furthermore, a structure is preferable, in which the heat source is sufficiently kept away from the first substrate 101 in order to relieve heat effects to the first substrate 101 and the first material layer 102 due to radiation of the heat source during standby, and an opening and shutting shutter is provided between the heat source and the first substrate 101, so that the heat source is close to the first substrate 101 only during heat treatment. A shutter is used in order to isolate the heat source and the first substrate 101 from each other, whereby the size of a film formation apparatus can be reduced.

The heat treatment may be performed by a method in which a heat source is made to approach the first substrate 101; but alternatively, the heat treatment may be performed by a method in which the first substrate 101 irradiated with light by a lamp. In this case, a lamp may be placed so that a rear surface of the first substrate 101 is irradiated with light. Here, a rear surface of the first substrate 101 refers to a main surface of the first substrate 101 on which the first material layer 102 is not formed.

A discharge lamp typified by a flash lamp (e.g., a xenon flash lamp and a krypton flash lamp), a xenon lamp, or a metal halide lamp; or an exothermic lamp typified by a halogen lamp or a tungsten lamp can be used as the lamp. By the flash lamp, emission with extremely high intensity is repeated in a short time (greater than or equal to 0.1 msec and less than or equal to 10 msec) and emission to a large area is possible; thus, uniform and efficient heating is possible regardless of the area of the first substrate 101. In addition, the flash lamp can control heating of the first substrate 101 by changing the interval of emission time. In addition, the running cost can be suppressed because of a long life and low power consumption at the time of waiting for light emission of the flash lamp. In addition, immediate heating is easily performed by using the flash lamp to simplify a vertical mechanism, a shutter, or the like in a case of using the heater or the like. Thus, the size of the film formation apparatus can be further reduced. However, a mechanism may be employed in which the flash lamp can vertically move so that the heating temperature can be adjusted depending on a material of the first substrate 101.

Here, film formation chambers which can realize a film formation method of the present invention is described with reference to FIGS. 2A to 4. FIGS. 2A to 2C each show a cross-sectional view of a film formation chamber in the case where a heater or the like is used as a heat source.

FIG. 2A is a cross-sectional view of a face-down film formation chamber. A film formation chamber 111 having a heat source 116 is connected to an adjacent transfer chamber, an adjacent load chamber, or the like through a first gate valve 112 and a second gate valve 113. The first substrate 101 over which the first material layer 102 is formed is supported by a first substrate supporting unit 114. Although not shown, the first material layer 102 includes the evaporation material 103. The second substrate 104 which is a substrate on which a film is formed is supported by a second substrate supporting unit 115 so that a distance d from a surface of the first material layer 102 is retained. The heat source 116 may have a structure which performs heat treatment by approaching the first substrate 101, or may control heat by opening and closing of a shutter which can be insulated from heat and is provided between the heat source 116 and the first substrate 101. When such a shutter is provided, the size of the film formation chamber 111 can be further reduced, time for vacuum evacuation is reduced, and consumption energy is reduced; accordingly, throughput can be further improved and the cost can be reduced.

FIG. 2B is a cross-sectional view of a face-up film formation chamber. A film formation chamber 121 having a heat source 126 is connected to an adjacent transfer chamber, an adjacent load chamber, or the like through a first gate valve 122 and a second gate valve 123. The first substrate 101 over which the first material layer 102 is formed is supported by the first substrate supporting unit 124. The first material layer 102 includes the evaporation material 103 in a similar manner to FIG. 2A. The second substrate 104 which is a substrate on which a film is formed is supported by the second substrate supporting unit 125 so that a distance d from a surface of the first material layer 102 is retained. As illustrated in FIG. 2A, a shutter is preferably provided between the heat source 126 and the first substrate 101. When a shutter is provided in such a manner, throughput can be further improved and the cost can be reduced.

FIG. 2C is a cross-sectional view of a film formation chamber employing vertical placement of a substrate. Although not shown, a film formation chamber 131 having a heat source 136 is connected to an adjacent transfer chamber, an adjacent load chamber, or the like through a gate valve in a similar manner to FIGS. 2A and 2B. The first substrate 101 over which the first material layer 102 is formed is supported by the first substrate supporting unit 134. The first material layer 102 includes the evaporation material 103 in a similar manner to FIGS. 2A and 2B. The second substrate 104 which is a substrate on which a film is formed is supported by the second substrate supporting unit 135 so that a distance d from a surface of the first material layer 102 is kept. As illustrated in FIG. 2A, a shutter is preferably provided between the heat source 136 and the first substrate 101. When a shutter is provided in such a manner, throughput can be further improved and the cost can be reduced.

Figure 3B:
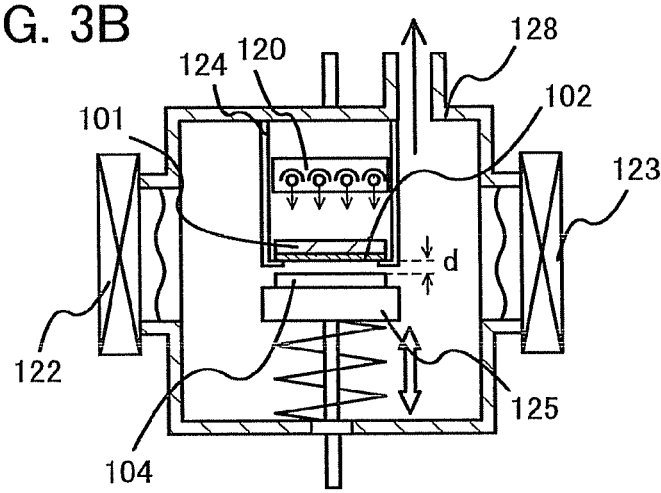
Figure 3C:
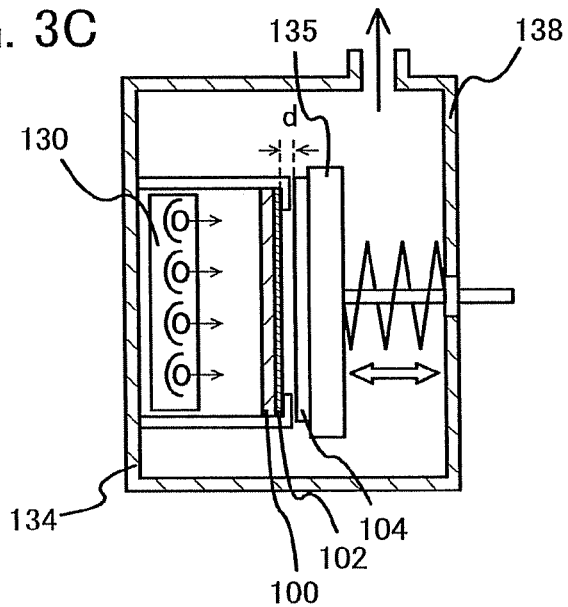

FIGS. 3A to 3C each show a cross-sectional view of a film formation chamber in the case where a lamp is used as a heat source. Since FIGS. 3A to 3C are similar to FIGS. 2A to 2C except that a lamp is used for a heat source, a detailed description thereof is omitted. A film formation chamber 118 shown in FIG. 3A has a lamp 110 as a heat source, a film formation chamber 128 shown in FIG. 3B has a lamp 120 as a heat source, and a film formation chamber 138 shown in FIG. 3C has a lamp 130 as a heat source. When a lamp is used as a heat source, the size of the film formation chamber can be reduced even without a shutter, and thus, throughput can be further improved and the cost can be reduced.

Figure 4:
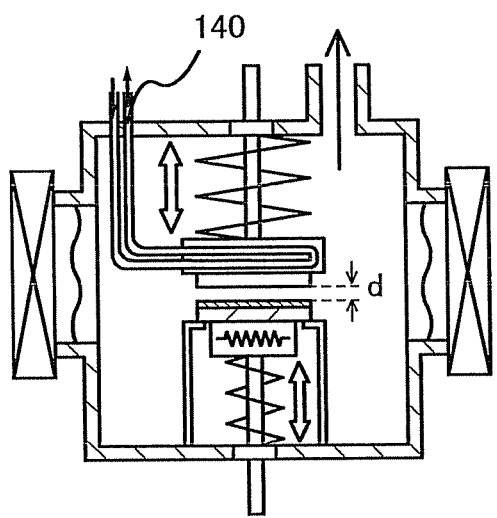
FIG. 4 is a view illustrating a film formation apparatus used for a film formation method of the present invention.

Besides, the first substrate 101 and the second substrate 104 may be cooled as needed. Cooling these substrates as needed makes it possible to use a flexible substrate such as a plastic substrate. Further, materials with different evaporation temperatures or sublimation temperatures can be used as an evaporation material. That is, the present invention can be used also for the case of co-evaporation. As shown in FIG. 4, a cooling unit 140 may be provided in the film formation apparatus so as to cool the substrates.

In the case where two or more kinds of materials as an evaporation material are co-evaporated, heat treatment is preferably performed at a temperature greater than or equal to the highest evaporation temperature or sublimation temperature of evaporation temperatures or sublimation temperatures of materials to be co-evaporated. In this case, the temperature of the heat treatment is preferably set high so as to exceed the highest evaporation temperature or sublimation temperature but does not exceed 50° C. more than the highest evaporation temperature or sublimation temperature. However, the temperature of the heat treatment may be set low (greater than or equal to the highest evaporation temperature or sublimation temperature) within the above-described temperature range in consideration of the decomposition temperature of a material with a lower evaporation temperature or a lower sublimation temperature, a distance from the substrate on which a film is formed, and a material and the thickness of the substrate on which a film is formed. For example, in the case where the second material layer 105 is a light-emitting layer of an organic EL element, the light-emitting layer can be a layer in which a plurality of compounds is mixed, such as a layer including a light-emitting material formed from an organic compound and a host material, owing to the employment of co-evaporation. In the case of performing co-evaporation, a ratio of a plurality of evaporation materials can be adjusted by adjustment of the concentration of each evaporation material in a solution to be a precursor of a binder material. Therefore, as compared to a conventional case of adjusting the concentration by co-evaporation in vacuum, such co-evaporation greatly facilitates the adjustment of the concentration, which is an advantage.

The film formation chambers shown in FIGS. 2A to 4 are subjected to vacuum evacuation. More specifically, the present invention is preferably implemented in a film formation chamber with the pressure less than or equal to 0.665 Pa, more preferably in a film formation chamber with the pressure greater than or equal to $10^{-6}$ Pa and less than or equal to $10^{-4}$ Pa. As a vacuum evacuation unit provided to be connected to the film formation chamber, an oil-free dry pump is used to evacuate the pressure of from the atmosphere to approximately 1 Pa, and in order to further increase the degree of vacuum, a magnetic levitation turbo molecular pump or a complex molecule pump is used to evacuate the pressure. A cryopump may be provided together in the film formation chamber in order to remove moisture. Accordingly, pollution by an organic material (such as oil) from the evacuation unit can be prevented. An inner wall surface of the film formation chamber is preferably subjected to mirror surface treatment by electrochemical polishing to reduce its surface area, so that the discharge of gas is reduced.

Here, the first substrate 101 which is an evaporation source substrate, the first material layer 102 which is a binder material layer, the evaporation source material 103, the second substrate 104 which is a substrate on which a film is formed, and the second material layer 105 will be described, which are used in this embodiment mode.

As the first substrate 101 which is an evaporation source substrate, an oxide substrate of quartz, ceramic, sapphire, or the like, or a conductive substrate formed from gold, platinum, copper, silver, tungsten, tantalum, titanium, aluminum, or an alloy material of any of these may be used. Alternatively, a substrate in which any of the above-described conductive materials is formed over an oxide substrate, or the like, can be used. Further alternatively, a conductive substrate in which a semiconductor material such as silicon (Si) or germanium (Ge) is formed can be used. The first substrate 101 is not limited to a specific one as long as it has a heat resistance property or the like needed for heat treatment.

Further, a light-transmitting substrate (a glass substrate, a quartz substrate, a plastic substrate including an inorganic material, or the like) over which an amorphous silicon film or a microcrystalline silicon film is formed may be used as the first substrate. When an amorphous silicon film or a microcrystalline silicon film is formed, light is absorbed efficiently by heat treatment using a flush lamp or the like. Accordingly, the first material layer 102 over the first substrate 101 can be uniformly heated.

The second substrate 104 which is a substrate on which a film is formed is not limited to a specific one as long as it is a substrate having a needed heat resistance property and having an insulating property on its surface. For example, a glass substrate, a quartz substrate, a stainless steel substrate provided with an insulating film, and the like can be given as the second substrate 104. Alternatively, a plastic substrate having a heat resistance property enough to withstand heat treatment may be used.

As a method for forming the first material layer 102 which is a mixture layer of an evaporation material and a binder material over the first substrate 101, an evaporation method, a sputtering method, a spin coating method, a printing method, a droplet discharge method (an ink-jet method), a spray method, a dripping method, a dispenser method, or the like is used. It is to be noted that a droplet discharge method includes an ejection method.

It is to be noted that a process of manufacturing the evaporation source substrate (a process of forming the first material layer 102 over a surface of the first substrate 101) is not needed to be performed in vacuum. Even when a low molecular material is used for an evaporation material, an evaporation source can be manufactured in a similar manner to a high molecular material, and an evaporation source can be manufactured even in the atmospheric air.

In this embodiment mode, the first material layer 102 is formed from a mixture of an evaporation material and a binder material which is a material of higher molecular weight than the evaporation material. Preferably, a low molecular material is used for the evaporation material, and a high molecular material is used for the binder material. The viscosity of a high molecular material can be easily adjusted, and thus, the viscosity of a solution which is to be a precursor of a binder material can be freely adjusted depending on a use. For example in the case where the first material layer 102 is formed by a droplet discharge method, the viscosity of a solution which is to be a precursor of a binder material is increased. Accordingly, the binder material does not spread over a surface over which a film is formed, and a fine pattern can be formed. Therefore, the evaporation source substrate can be manufactured by a wet process.

The viscosity of the binder material can be adjusted by adjusting molecular weight of a high molecular material or changing a ratio of a high molecular material, which is a binder material, to a low molecular material which is an evaporation material. In general, the viscosity of the mixture is increased as a ratio of a high molecular material is increased.

The binder material is not particularly limited as long as it can be formed by a wet process. For example, acrylic, polyimide, or the like, or a high molecular EL material may be used. As the high molecular EL material, for example, poly(N-vinylcarbazole) (PVK) and poly(p-phenylenevinylene) (PPV) can be given.

As the evaporation material, the following can be used: copper phthalocyanine (CuPc), 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4,4'-bis(N-{4[N'-(3-methylphenyl)-N'-phenylamino]phenyl}-N-phenylamino)biphenyl (DNTPD), tris(8-quinolinolato) aluminum (abbreviation: Alq), tris(4-methyl-8-quinolinolato)aluminum (abbreviation: Almq$_3$), bis(2-methyl-8-quinolinolato)(4-phenylphenolate)aluminum (abbreviation: BAlq), 4,4'-di(N-carbazolyl)biphenyl (abbreviation: CBP), 2-tert-butyl-9,10-di(2-naphthyl)anthracene (abbreviation: t-BuDNA), 4,4'-bis(2,2-diphenylvinyl)biphenyl (abbreviation: DPVBi), bathophenanthroline (abbreviation: BPhen), bathocuproine (abbreviation: BCP), 3-(2-benzothiazole)-7-(diethylamino)coumarin, or 3-(2-benzothiazolyl)-7-(diethylamino)coumarin (abbreviation: coumarin 6).

Although this embodiment mode describes the case where the first material layer 102 is formed over an entire surface of the first substrate 101, the first material layer 102 may be selectively formed. In this case, a mask provided with an opening having a desired pattern may be placed between the first substrate 101 which is an evaporation source substrate and the second substrate 101 which is a substrate on which a film is formed, in evaporation. In particular, in the present invention, a distance between the mixture layer of the evaporation material and the binder material which is provided over the first substrate, and the second substrate which is a substrate on which a film is formed can be decreased. Accordingly, expansion in the evaporation direction is suppressed, and thus, evaporation involving an unwanted material entering through the mask can be prevented. "The evaporation involving an unwanted material entering through a mask" refers to that a film formation region over a substrate on which a film is formed is larger than an opening region of a mask. In a film formation method using a conventional evaporation apparatus, the evaporation involving an unwanted material entering through a mask tends to be caused since a distance between an evaporation source and a substrate on which a film is formed is 1 m or more, and thus, it is difficult to obtain a fine film formation pattern. However, in the present invention, a pattern can be formed without such a problem.

Although this embodiment mode describes the case of using one substrate as a substrate on which a film is formed, a plurality of substrates on each of which a film is formed may be arranged so as to face one evaporation source substrate. In this case, a plurality of substrates on each of which a film is formed and one evaporation source substrate are set to have almost the same area. When a plurality of substrates on each of which a film is formed is provided with respect to one evaporation source substrate, a plurality of substrates on each of which a film is formed can be concurrently treated.

In this embodiment mode, a distance between the first substrate and the second substrate is reduced in order to improve utilization efficiency of a material (the first substrate and the second substrate are placed so that a distance d therebetween is reduced). However, the present invention is not limited thereto. When utilization efficiency of a material is not taken into consideration, a distance d which is a distance between the first substrate and the second substrate may be longer than 100 mm.

In this embodiment mode, a substrate is used which is provided with a mixture layer of an evaporation material and a material of higher molecular weight than the evaporation material (here, a binder material) as an evaporation source, and which has almost the same area as a substrate on which a film is formed. However, the present invention is not limited thereto, and it is not necessary to use an evaporation source having almost the same area as a substrate on which a film is formed. In the case where uniformity of a film thickness is not especially important, a mixture of an evaporation material and a material of higher molecular weight than the evaporation material may be put in a crucible, an evaporation boat, or the like, and this may be used as an evaporation source, for example.

This embodiment mode can be freely combined with any of other embodiment modes.

Embodiment Mode 2

This embodiment mode describes an example of a mode of the present invention, which is different from Embodiment Mode 1, with reference to the drawings. In specific, the case is described where a mixture layer is selectively formed over an evaporation source substrate.

Figure 5A:
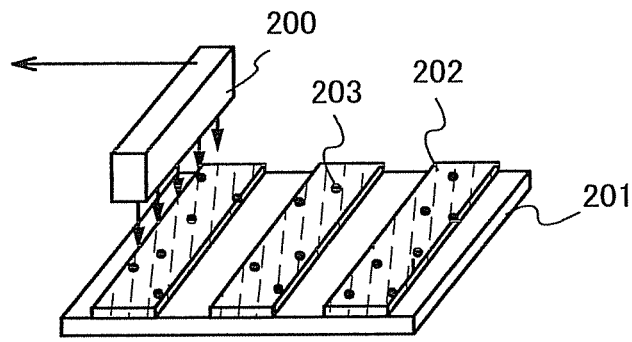
FIGS. 5A to 5C are perspective views illustrating a film formation method of the present invention.
Figure 5B:
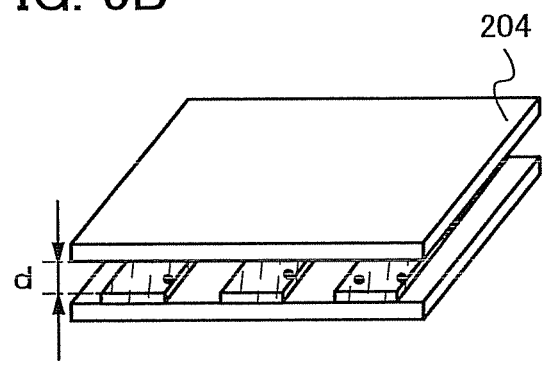
Figure 5C:
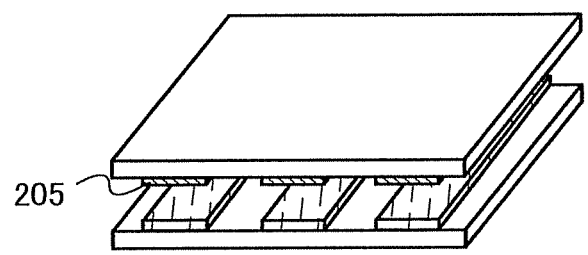

FIGS. 5A to 5C show an example of the case where a mixture layer is selectively formed. Here, a first material layer 202 which is a mixture layer is formed over a first substrate 201 which is an evaporation source substrate by an ink-jet method. First, a mixture layer of an evaporation material 203 and a material of higher molecular weight than the evaporation material 203 is discharged from a head 200, whereby the first material layer 202 is selectively formed over a main surface of the first substrate 201 (see FIG. 5A). Here, the first substrate 201 serves as an evaporation source substrate.

Next, a second substrate 204 is placed so as to face the first substrate 201 (see FIG. 5B). Here, the second substrate 204 is a substrate on which a film is formed. The second substrate 204 is placed to face the first material layer 202 formed over the first substrate 201. A surface of the first material layer 202 and a surface of the second substrate 204 are placed to have a distance d therebetween. Here, the distance d is preferably greater than or equal to 0 mm and less than or equal to 100 mm, more preferably greater than or equal to 0 mm and less than or equal to 10 mm.

It is to be noted that a distance d is defined as a distance between a surface of the binder material layer including the evaporation material over the first substrate and a surface of the second substrate. However, in the case where a certain kind of film (for example, a conductive film serving as an electrode, a partition wall, or the like) is formed on a second substrate and thus a surface of the second substrate has unevenness, the distance d is defined as a distance between a surface of the binder material layer including the evaporation material over the first substrate and a topmost surface of a layer formed on the second substrate, that is, a surface of the film (the conductive film, the partition wall, or the like).

Then, the first substrate 201 is subjected to heat treatment to evaporate or sublimate the evaporation material 203 from the first material layer 202 provided over a main surface of the first substrate 201. From the evaporated or sublimated evaporation material 203, a second material layer 205 is selectively formed over a main surface of the second substrate 204 (see FIG. 5C). The heat treatment is performed so that an entire surface of the first substrate 201 is heated.

A film formation method of the first material layer 202 is not limited to a droplet discharge method. For example, a pattern may be formed by a photolithography method after the first material layer 202 is formed over an entire surface of the first substrate 201 by a spin coating method.

This embodiment mode has a similar structure to Embodiment Mode 1 except for selective formation of the binder material layer over the evaporation source substrate. Accordingly, this embodiment mode can be freely combined with Embodiment Mode 1.

Embodiment Mode 3

This embodiment mode describes an example of a mode of the present invention, which is different from Embodiment Mode 1, with reference to the drawings. In specific, the case is described where a thermally conductive layer is selectively formed over an evaporation source substrate and a binder material layer is formed over the evaporation source substrate and the thermally conductive layer.

FIGS. 6A to 6D show an example of the case where a thermally conductive layer is selectively formed. Here, a thermally conductive layer 302 is formed over the first substrate 301 by an ink-jet method. First, a material which forms the thermally conductive layer 302 is discharged from a head 300 to selectively form the thermally conductive layer 302 over a main surface of the first substrate 301 (see FIG. 6A). Here, the first substrate 301 serves as an evaporation source substrate.

The thermally conductive layer is not particularly limited as long as it is formed from a material with high thermal conductivity. For example, metal such as aluminum may be used.

Next, a first material layer 303 is formed over the first substrate 301 over which the thermally conductive layer 302 is formed. The first material layer 303 is a binder material layer including an evaporation material 304.

Figure 6A:
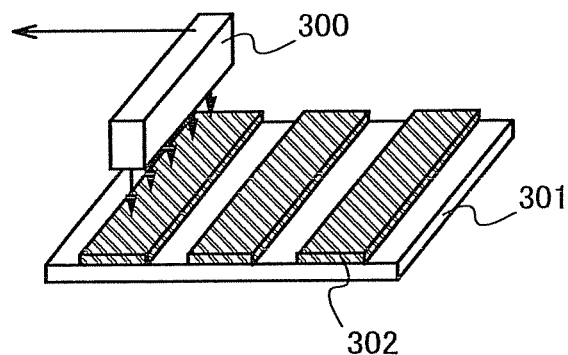
FIGS. 6A to 6D are perspective views illustrating a film formation method of the present invention.
Figure 6B:
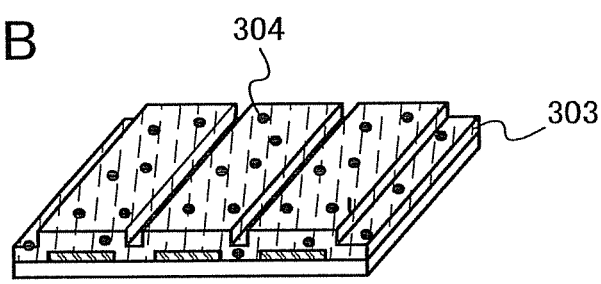
Figure 6C:
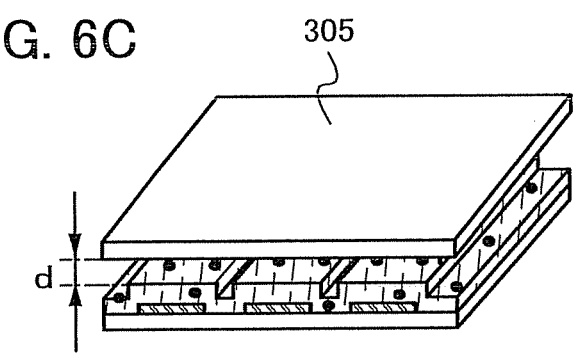
Figure 6D:
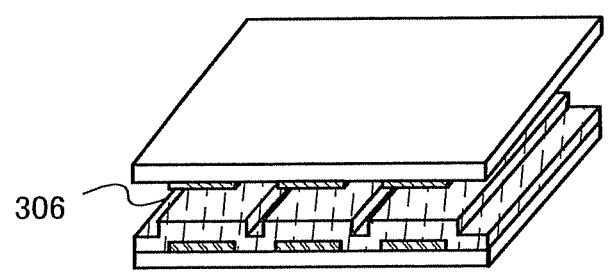

A second substrate 305 is placed so as to face the first substrate 301 (see FIG. 6C). Here, the second substrate 305 is a substrate on which a film is formed. The second substrate 305 is placed to face the first material layer 303 formed over the first substrate 301. A surface of the first material layer 303 and a surface of the second substrate 305 are placed to have a distance d therebetween. Here, a distance d is preferably greater than or equal to 0 mm and less than or equal to 100 mm, more preferably greater than or equal to 0 mm and less than or equal to 10 mm.

It is to be noted that a distance d is defined as a distance between a surface of the binder material layer including the evaporation material over the first substrate and a surface of the second substrate. However, in the case where a certain kind of film (for example, a conductive film serving as an electrode, a partition wall, or the like) is formed on a second substrate and thus a surface of the second substrate has unevenness, the distance d is defined as a distance between a surface of the binder material layer including the evaporation material over the first substrate and a topmost surface of a layer formed on the second substrate, that is, a surface of the film (the conductive film, the partition wall, or the like).

Then, the first substrate 301 is subjected to heat treatment to evaporate or sublimate the evaporation material 304 from the first material layer 303 provided over a main surface of the first substrate 301. From the evaporated or sublimated evaporation material 304, a second material layer 306 is selectively formed over a main surface of the second substrate 305 (see FIG. 6D). The heat treatment is performed so that an entire surface of the first substrate 301 is heated.

A film formation method of the thermally conductive layer 302 is not limited to a droplet discharge method. For example, a pattern may be formed by a photolithography method after the thermally conductive layer 302 is formed over an entire surface of the first substrate 301 by a spin coating method.

The thermally conductive layer 302 may be formed by selective removal of a conductive material layer formed over a conductive substrate or a conductive material layer formed over an oxide substrate.

As described above, in the case where a thermally conductive layer is selectively formed over a first substrate and a mixture layer of an evaporation material and a binder material is formed over the thermally conductive layer, the mixture layer of the evaporation material and the binder material can be locally heated, and thus, partial film formation is possible. That is, an evaporation material can be selectively formed without selective formation of a mixture layer. In view of this point, a distance d which refers to a distance between a surface of a mixture layer of an evaporation material and a binder material which is provided over a first substrate, and a surface (a surface on which a film is formed) of a second substrate which is a substrate on which a film is formed, is preferably short.

This embodiment mode has a similar structure to Embodiment Mode 1 except for provision of a thermally conductive layer, which is selectively formed, over an evaporation source substrate. Accordingly, this embodiment mode can be freely combined with Embodiment Mode 1.

Embodiment 1

Figure 7:
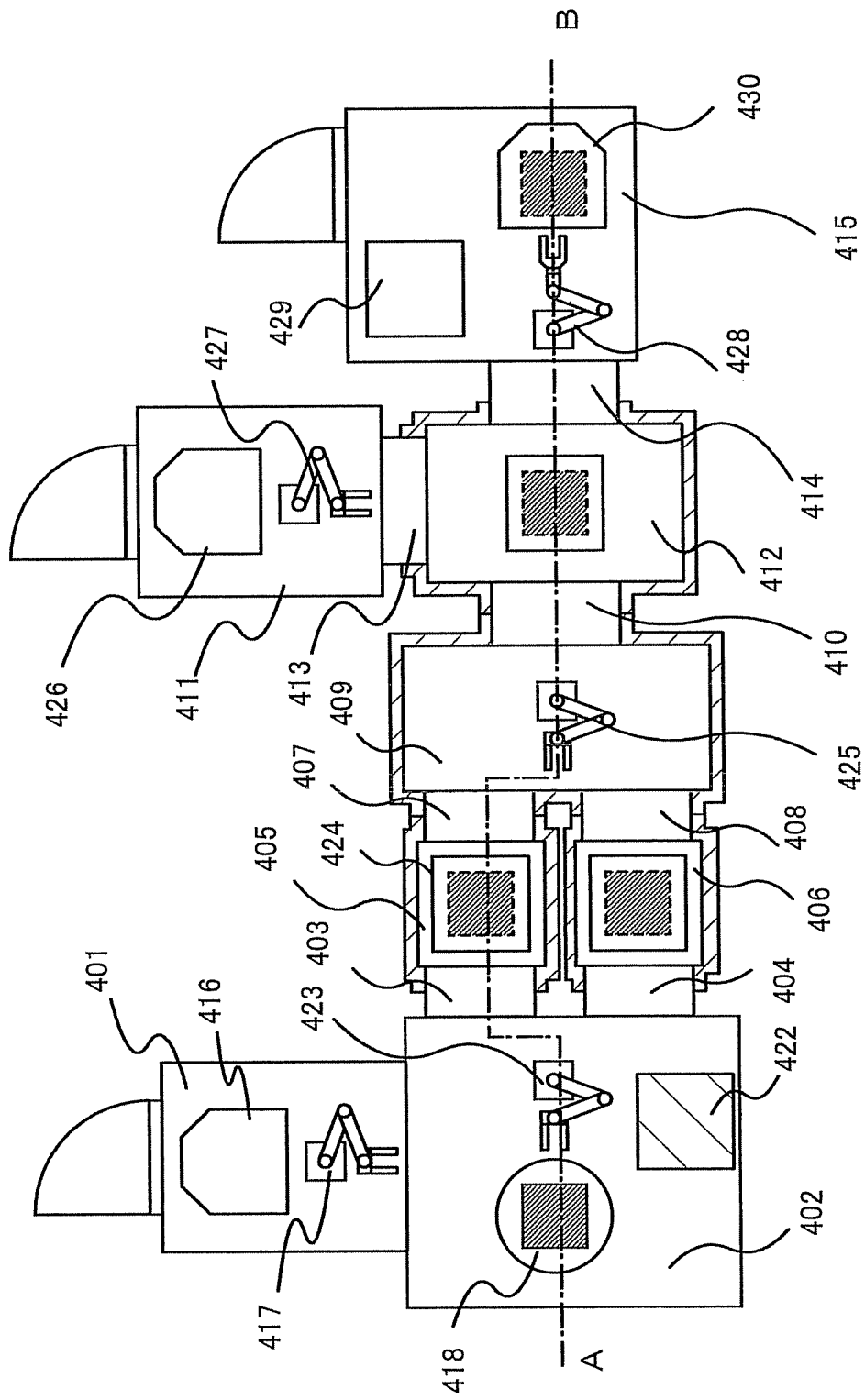
FIG. 7 is a top view illustrating a manufacturing apparatus of Embodiment 1.
Figure 8:
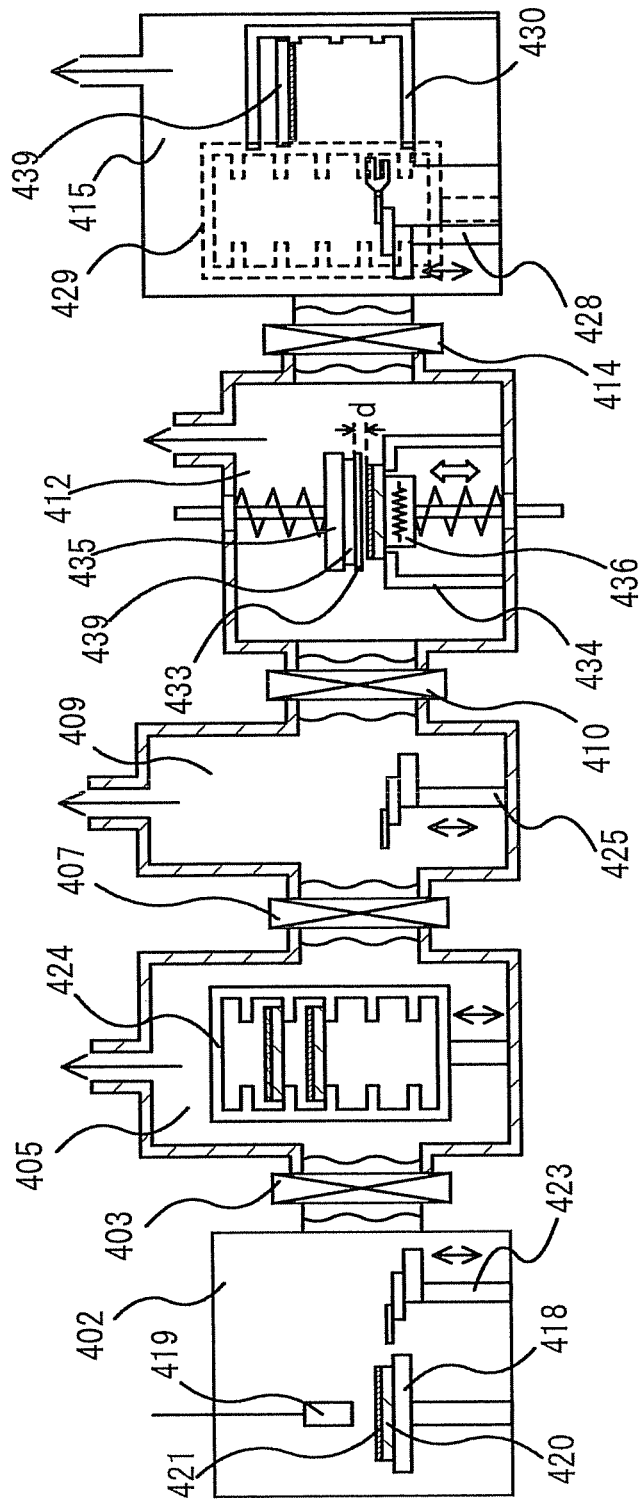
FIG. 8 is a cross-sectional view illustrating a manufacturing apparatus of Embodiment 1.

This embodiment describes an example of an automated multi-chamber manufacturing apparatus with which the present, invention can be implemented, with reference to FIG. 7 and FIG. 8.

FIG. 7 is a top view of the multi-chamber manufacturing apparatus. FIG. 8 corresponds to a cross section taken along a dashed line A-B.

First, an arrangement in the manufacturing apparatus is described with reference to FIG. 7. A first load chamber 401 in which a first substrate (an evaporation source substrate) is set is connected to a first film formation chamber 402. The first film formation chamber 402 is connected to a first stock chamber 405 through a first gate valve 403, and to a second stock chamber 406 through a second gate valve 404. The first stock chamber 405 is connected to a transfer chamber 409 through a third gate valve 407. The second stock chamber 406 is connected to the transfer chamber 409 through a fourth gate valve 408.

In the first film formation chamber 402, it is possible to form an environment such as an atmosphere in which the number of ozone is controlled as needed or a nitrogen atmosphere in which the oxygen density and the dew point are controlled. Further, a hot plate or an oven is included to perform drying or the like after coating. The first film formation chamber 402 preferably has a function of surface cleaning or of improvement in wettability with a UV lamp or the like as needed. The first film formation chamber 402 is a film formation apparatus which finals a film over the evaporation source substrate in the atmospheric pressure environment, and the first stock chamber 405 is a chamber to store the evaporation source substrate over which a film is formed in the atmospheric pressure environment as well as to deliver it to a second film formation chamber 412 that is evacuated to a vacuum. In such a structure, evacuation is necessary each time after process of the predetermined number of evaporation source substrates. In other words, time taken for vent and exhaust of the first stock chamber 405 directly affects throughput of the manufacturing apparatus. Accordingly, as illustrated in FIG. 7, two transfer courses are provided. The two transfer courses enable efficient processes of a plurality of substrates to reduce process time per substrate. For example, while the first stock chamber 405 is vented and exhausted, the second stock chamber 406 can store the evaporation source substrate over which a film formed in the first film formation chamber 402. Moreover, the present invention is not limited to the two transfer courses and three or more transfer courses may be provided.

The transfer chamber 409 is connected to the second film formation chamber 412 through a fifth gate valve 410. A second load chamber 411 in which a second substrate is set is connected to the second film formation chamber 412 through a fifth gate valve 413. The second film formation chamber 412 is connected to an unload chamber 415 through a sixth gate valve 414.

Hereinafter, a procedure is described in which the evaporation source substrate that is the first substrate is transferred into the manufacturing apparatus, and the second substrate provided with a thin film transistor, an anode (a first electrode), and an insulator to cover an end of the anode is transferred beforehand into the manufacturing apparatus shown in FIG. 7 to manufacture a light-emitting device.

First, the evaporation source substrate that is the first substrate is set in the first load chamber 401. A cassette 416 storing a plurality of evaporation source substrates is made to be provided.

Subsequently, the evaporation source substrate is transferred onto a stage 418 in the first film formation chamber 402 by a transfer robot 417. In the first film formation chamber 402, a material layer 421 is formed over the evaporation source substrate by a coating apparatus using spin coating. It is to be noted that the present invention is not limited to the coating apparatus using spin coating and a coating apparatus using a spray method, an ink-jet method, or the like can be used. Furthermore, the evaporation source substrate surface is subjected to UV treatment as needed. If baking is needed, a hot plate 422 is used. FIG. 8 illustrates a state in the first film formation chamber 402 as a cross section in which a material solution is dropped from a nozzle 419 and the material layer 421 is formed over the evaporation source substrate 420 that is placed on the stage 418. Here, a material solution obtained by dispersing a light-emitting organic material in a high molecular material is dropped and baked to form the material layer 421.

Subsequently, the evaporation source substrate is transferred to the first stock chamber 405 by a transfer robot 423 with the second gate valve 403 opened. After the transfer, the pressure in the first stock chamber 405 is reduced. As shown in FIG. 8, a structure is preferable in which a plurality of evaporation source substrates can be stored in the first stock chamber 405, here, in particular, a stock holder 424 capable of vertical movement. Moreover, a mechanism may be provided in which the evaporation source substrate can be heated in the first stock chamber. The first stock chamber 405 is connected to a vacuum evacuation treatment chamber. After the evacuation, an inert gas is preferably introduced to the first stock chamber 405 to obtain the atmospheric pressure.

Next, after the pressure in the first stock chamber 405 is reduced, the evaporation source substrate is transferred to the transfer chamber 409 with the third gate valve 407 opened and then transferred to the second film formation chamber 412 with the fifth gate valve 410 opened. The transfer chamber 409 is connected to the vacuum evacuation treatment chamber, and evacuation in advance to maintain a vacuum is preferable so that moisture or oxygen does not enter the transfer chamber 409 as much as possible. The evaporation source substrate is transferred by a transfer robot 425 provided in the transfer chamber 409.

Through the procedure so far, the evaporation source substrate over which the material layer is formed is set in the second film formation chamber 412. Then, the procedure is described in which the second substrate 439 that is in advance provided with the thin film transistor, the anode (first electrode), and the insulator that covers an end of the anode is set in the film formation chamber 412 at the same time. First, the cassette 426 storing a plurality of second substrates is set in the second load chamber 411. The second load chamber 411 is connected to the vacuum evacuation treatment chamber; after the evacuation, the second substrate is transferred to the second film formation chamber 412 by a transfer robot 427 with the fifth gate valve 413 opened.

Through the above procedure, the evaporation source substrate 420 and the second substrate 439 are set in the second film formation chamber 412. The second film formation chamber 412 corresponds to the film formation apparatus shown in FIGS. 2A to 4.

In the film formation chamber 412, at least an evaporation source substrate supporting base 434 which is a first substrate supporting unit, a second substrate supporting base 435 which is a second substrate supporting unit, and a heater capable of vertical movement as a heat source 436 are included. In addition, a mask 433 for selective film formation is placed to overlap with the second substrate 439. The mask 433 and the second substrate 439 are preferably aligned in advance.

A surface over which the material layer 421 is formed of the evaporation source substrate 420 is fixed to the substrate supporting mechanism to face a surface of the second substrate 439, on which the material layer 421 is to be formed. Next, the second substrate supporting base 435 is moved until a distance between the material layer 421 and the second substrate 439 is reduced to be a distance d. The distance d is preferably set to greater than or equal to 0 mm and less than or equal to 100 mm, more preferably greater than or equal to 0 mm and less than or equal to 10 mm. It is to be noted, because the second substrate 439 is a glass substrate, a lower limit of the distance d is 0.5 mm in consideration of bend thereof. Because the mask is interposed in this embodiment, the distance d is set to 5 mm. This distance d is determined so that the mask 433 and the second substrate 439 are at least not in contact with each other. The shorter the distance d is, the more expansion in the evaporation direction can be suppressed to prevent evaporation involving an unwanted material entering through a mask.

Subsequently, as illustrated in FIG. 8, the heat source 436 is made to approach the evaporation source substrate 420 while retaining the distance d. A heater capable of vertical movement under the evaporation source substrate is used as the heat source 436. Although the heater is basically set to become constant at a predetermined temperature, the temperature may be controlled so that the temperature is raised or lowered in the range in which the tact time is not affected.

When the heat source 436 is made to approach the evaporation source substrate 420, the material layer 421 on the evaporation source substrate is heated in a short time by direct heat conduction so that an evaporation material is evaporated or sublimated, and the evaporation material is formed on the surface on which a film is faulted (i.e., lower flat surface) of the second substrate 439 that is placed to face the material layer 421. In this embodiment, a light-emitting organic material which is dispersed in the material layer 421 is evaporated or sublimated and formed over the second substrate 439, and a high molecular material remains over the evaporation source substrate. The film formation is selectively performed over a region in which a material passes through an opening of the mask 433. In addition, film thickness uniformity of the film formation on the lower flat surface of the second substrate 439 can be less than 3%.

Accordingly, a light-emitting layer can be formed on the anode (first electrode) on the second substrate. Before the light-emitting layer is formed, a hole injecting layer or a hole transporting layer may be similarly formed in the second film formation chamber to be stacked. After the light-emitting layer is formed, an electron transporting layer or an electron injecting layer may be similarly formed in the second film formation chamber to be stacked. Furthermore, after the light-emitting layer is formed, a cathode (a second electrode) is similarly formed in the second film formation chamber to be stacked. Through the above-mentioned process, a light-emitting element including, at least, the thin film transistor, the anode (the first electrode), the light-emitting layer, and the cathode (the second electrode) can be manufactured on the second substrate.

For efficient manufacture of the light-emitting device, evaporation source substrates over which a plurality of different material layers are formed may be stored in the evaporation source substrate stock holder 424, and the evaporation source substrate may be sequentially exchanged to be stacked with the second substrate set on the second substrate supporting base 435. For example, the following evaporation source substrates may be prepared so that the evaporation source substrate to be set in the second film formation chamber 412 is sequentially exchanged to be stacked: a first evaporation source substrate over which a material layer to serve as a hole injecting layer is formed, a second evaporation source substrate over which a material layer to serve as a hole transporting layer is formed, a third evaporation source substrate over which a material layer to serve as a light-emitting layer is formed, a fourth evaporation source substrate over which a material layer to serve as an electron transporting layer is formed, a fifth evaporation source substrate over which a material layer to serve as an electron injecting layer is formed, and a sixth evaporation source substrate over which a layer which contains aluminum as its main component to serve as the cathode is formed. Even if different material layers are formed in the same film formation chamber in this manner, expansion of the evaporation can be suppressed because of the short distance d to prevent mixture of the materials of the material layers.

In addition, for manufacture of a full color light-emitting device, the following evaporation source substrates may be prepared so that the evaporation source substrate to be set in the second film formation chamber 412 is sequentially exchanged to be stacked: a first evaporation source substrate over which a red light-emitting layer is formed, a second evaporation source substrate over which a blue light-emitting layer is formed, and a third evaporation source substrate over which a green light-emitting layer is formed. It is to be noted that the mask is needed to be exchanged. Even if different light-emitting layers are formed in the same film formation chamber in this manner, expansion of the evaporation can be suppressed because of the short distance d to prevent mixture of the materials of the light-emitting layers, and accordingly, color purity of each light-emitting element can be obtained.

After film formation on the second substrate 439 is completed, the second substrate 439 is transferred to the unload chamber 415 with the sixth gate valve 414 opened. The unload chamber 415 is also connected to the vacuum evacuation treatment chamber. In the unload chamber 415, the pressure is reduced by the time the second substrate 439 is transferred. The second substrate 439 is stored in a cassette 430 by using a transfer robot 428. It is to be noted that the second substrate 439 is set in the cassette 430 so that the surface over which a film has been formed faces downward to prevent impurities such as dust from adhering. As long as the evaporation source substrate 420 has the same size and thickness as the second substrate 439, the evaporation source substrate 420 can also be stored in the cassette 430 by using the transfer robot 428. Further, a mask stock holder 429 may be provided in the unload chamber 415. For separately coloring light-emitting layers, or the like, a mask is desirably prepared for each light-emitting color. The mask stock holder 429 can store a plurality of masks that are needed.

A sealing chamber to seal the light-emitting element may be connected to the unload chamber 415. The sealing chamber is connected to a load chamber to transfer a sealing can or a sealing substrate. The second substrate and the sealing substrate are attached to each other in the sealing chamber. At that time, a substrate inversion mechanism is preferably provided in the transfer robot 428 if the second substrate is desirably inverted.

A magnetic levitation turbo molecular pump, a cryopump, or a dry pump is provided in the vacuum evacuation treatment chamber. Accordingly, the ultimate vacuum of the transfer chamber connected to a feed chamber can be set to $10^{-5}$ to $10^{-6}$ Pa, and reverse diffusion of impurities from the pump side and the exhaust system can be further suppressed. An inert gas such as nitrogen or a rare gas is used as a gas to be introduced in order to prevent the impurities from being introduced into the apparatus. A gas that is highly purified by a gas refiner before the introduction into the apparatus is used as the gas to be introduced into the apparatus. Thus, the gas refiner needs to be provided so that the gas is introduced into the evaporation apparatus after it is highly purified. Accordingly, oxygen, moisture, or other impurities in the gas can be removed beforehand to prevent these impurities from being introduced into the apparatus.

Although the transfer robot is given as an example of transferring the evaporation source substrate or a substrate on which a film is formed, the transfer unit is not limited in particular and a roller or the like may be used. In addition, the position where the transfer robot is provided is not particularly limited to the arrangements in FIG. 7 and FIG. 8 and may be set to a desired position.

Although the film formation apparatus using a spin coating method is described as an example in this embodiment, alternatively, a droplet discharge apparatus using an ink-jet method may be provided in a film formation chamber.

Figure 9:
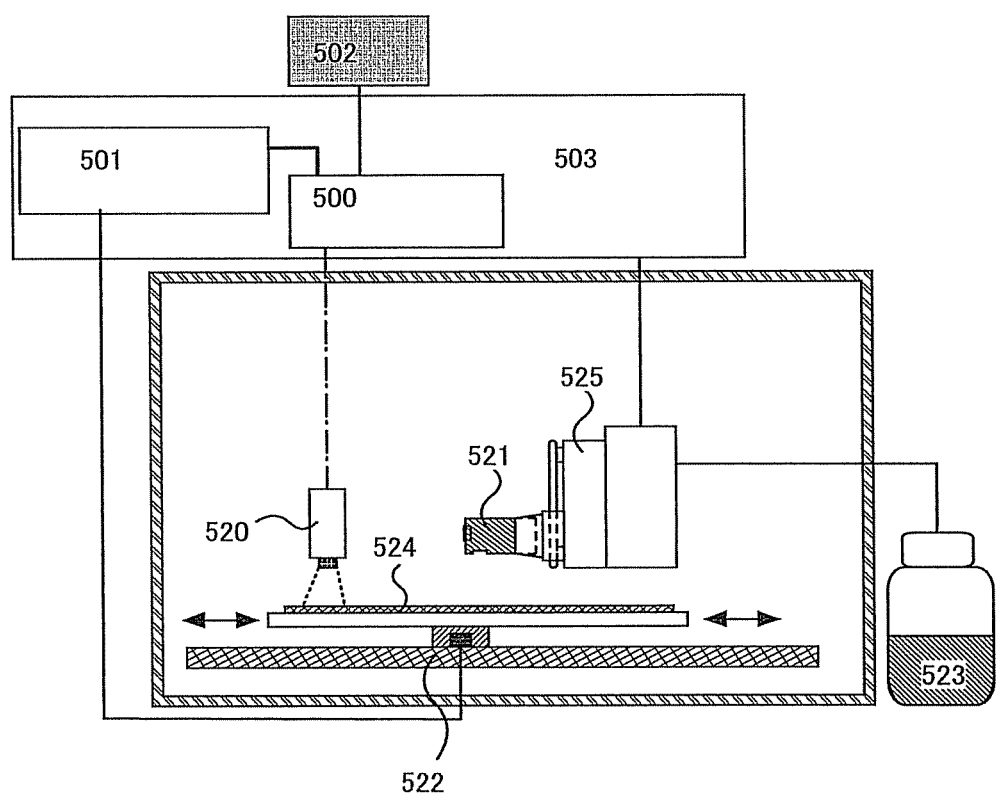
FIG. 9 is a cross-sectional view illustrating a manufacturing apparatus of Embodiment 1.

The droplet discharge apparatus is roughly described with reference to FIG. 9. A droplet discharge unit 525 provided with a head with a plurality of nozzles arranged in an axial direction, a control portion 503 to control the droplet discharge unit 525, a stage 522 that fixes a substrate 524 and moves in X, Y, and θ directions, and the like are included. This stage 522 also has a function to fix the substrate 524 by a technique such as vacuum chuck. A composition is discharged to the substrate 524 from a discharging outlet of each nozzle included in the droplet discharge unit 525 to form a pattern.

The control portion 503 controls the stage 522 and the droplet discharge unit 525. The control portion 503 includes a stage alignment portion 501. The control portion 503 also controls an imaging unit 520 such as a CCD camera. The imaging unit 520 detects the position of a marker, and supplies the detected information to the control portion 503. The detected information can also be displayed on a monitor 502. In addition, the control portion 503 includes an alignment control portion 500. The composition is supplied from an ink bottle 523 to the droplet discharge unit 525.

In forming a pattern, the droplet discharge unit 525 may be moved, or the stage 522 may be moved with the droplet discharge unit 525 fixed. For moving the droplet discharge unit 525, however, acceleration of the composition, a distance between the nozzles provided with the droplet discharge unit 525 and an object to be processed, and the environment need to be considered.

In addition, although not shown, a movement mechanism in which a head 521 moves vertically, a control unit thereof, and the like may be provided as accompanying components in order to improve the accuracy of the reaching. Then, the distance between the head 521 and the substrate 524 can be changed depending on the properties of the composition to be discharged. Furthermore, a gas supply unit and a shower head may be provided. If they are provided, the atmosphere can be substituted for an atmosphere of the same gas as a solvent of the composition to prevent drying to some extent. Moreover, a clean unit or the like to supply clean air and to reduce dust in a work area may be provided. Further, although not shown, a unit to measure various values of physical properties such as temperature and pressure may be provided as well as a unit to heat a substrate, as needed. These units can be collectively controlled by the control unit provided outside a chassis. Furthermore, if the control unit is connected to a manufacturing management system through an LAN cable, a wireless LAN, an optical fiber, or the like, the process can be uniformly managed from the outside to lead to improvement in productivity. It is to be noted that evacuation for the operation under reduced pressure may be performed in order to hasten drying of the composition that reaches the object and to remove solvent components of the composition.

In the manufacturing apparatus of this embodiment, scattering of a material in a vacuum chamber can be suppressed with a distance between the substrate on which a film is formed and the evaporation source substrate of greater than or equal to 0 mm and less than or equal to 100 mm, more preferably greater than or equal to 0 mm and less than or equal to 10 mm. Thus, the interval of maintenance such as cleaning in the film formation chamber and the like can be lengthened. Furthermore, in the manufacturing apparatus of this embodiment, the first film formation chamber 402 and the second film formation chamber 412 are a face-up film formation apparatus and a face-down film formation apparatus, respectively; accordingly, smooth film formation process can be achieved without inverting the evaporation source substrate and the substrate on which a film is formed in the middle of the transfer thereof.

In a multi-chamber manufacturing apparatus, effect of the present invention can be sufficiently obtained with at least one film formation chamber 412. Therefore, a film formation chamber using a known film formation method such as an evaporation method may be provided to be connected to the second film formation chamber 412.

It is to be noted that the manufacturing apparatus described in this embodiment can be implemented by freely using the film formation method described in Embodiment Mode 1.

For example, in a case of employing a face-up film formation apparatus as the second film formation chamber 412, a mechanism to invert the top and bottom of the evaporation source substrate in the middle of the transfer from the first film formation chamber 402 to the second film formation chamber 412 is provided. At this time, smooth film formation can be realized by employing a face-down film formation apparatus using evaporation as the first film formation chamber 402.

Instead, in the case of using the film formation apparatus employing vertical placement of a substrate for the second film formation chamber 412, a mechanism to place a surface of the evaporation source substrate perpendicular to the horizontal plane in the middle of transferring the evaporation source substrate from the first film formation chamber 402 to the second film formation chamber 412 is provided. In addition, a mechanism to place the substrate on which a film is formed perpendicular to the horizontal surface in the middle of transferring the substrate on which a film is formed from the second load chamber 411 to the second film formation chamber 412 is provided.

This embodiment can be implemented by being freely combined with the content described in Embodiment Modes 1 to 3 as appropriate.

Embodiment 2

This embodiment describes an example of a method for manufacturing a passive-matrix light-emitting device, to which the present invention is applied, with reference to the drawings.

In a passive-matrix (simple-matrix) light-emitting device, a plurality of anodes arranged in stripes (strip-form) is provided perpendicularly to a plurality of cathodes arranged in stripes. A light-emitting layer or a fluorescent layer is interposed at each intersection. Therefore, a pixel at an intersection of an anode selected (to which a voltage is applied) and a cathode selected emits light.

FIG. 10A is a top view of a pixel portion before sealing. FIG. 10B is a cross-sectional view taken along a dashed line A-A' in FIG. 10A. FIG. 10C is a cross-sectional view taken along a dashed line B-B' in FIG. 10A.

An insulating film 604 is formed on a first substrate 601 as a base film. It is to be noted that the base film need not be formed if not necessary. A plurality of first electrodes 613 is arranged in stripes at regular intervals on the insulating film 604. A partition wall 614 having openings is provided over the first electrodes 613 so as to correspond to each pixel. The partition wall 614 having openings is formed using an insulating material (a photosensitive or nonphotosensitive organic material (polyimide, acrylic, polyamide, polyimide amide, resist, or benzocyclobutene) or an SOG film (such as an $SiO_x$ film containing an alkyl group)). It is to be noted that openings each corresponding to the pixel becomes light-emitting regions 621.

A plurality of inversely tapered partition walls 622 which are parallel to each other and intersect with the first electrodes 613 are provided on the partition wall 614 having openings. The inversely tapered partition walls 622 are formed by a photolithography method using a positive-type photosensitive resin of which a portion unexposed to light remains as a pattern, and by adjusting the amount of light exposure or the length of development time so that a lower portion of a pattern is etched more.

Figure 11:
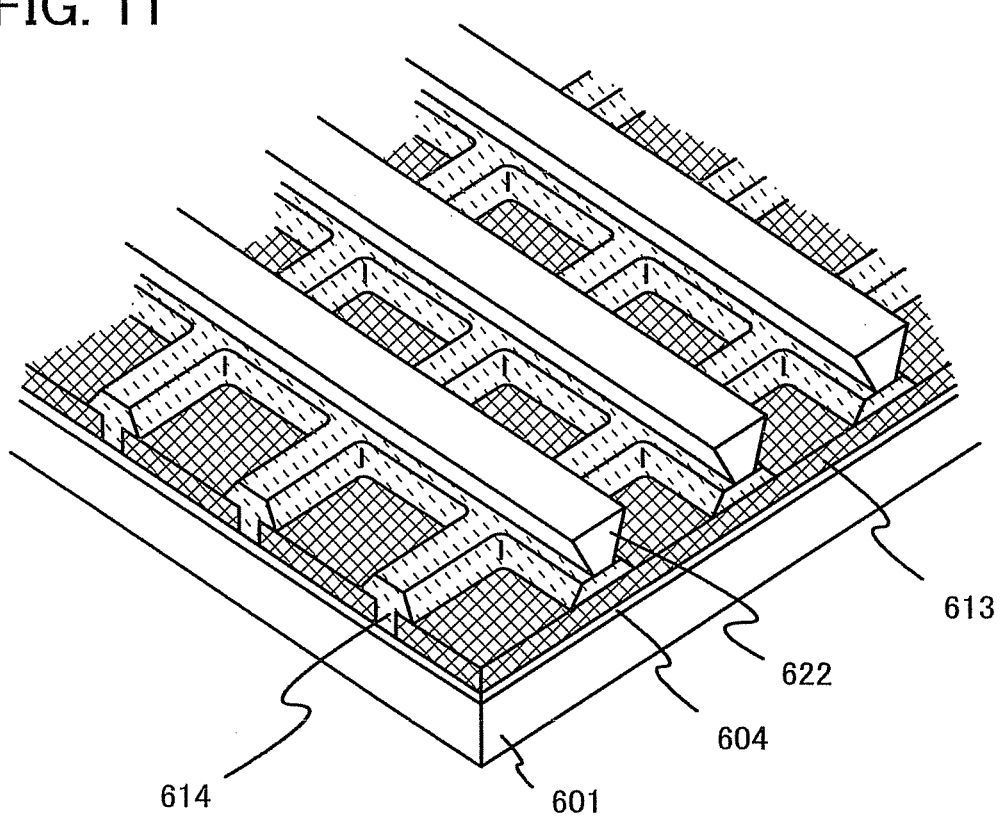
FIG. 11 is a perspective view of a passive-matrix light-emitting device to which the present invention is applied.

FIG. 11 is a perspective view immediately after formation of the plurality of inversely tapered partition walls 622 which is parallel to each other. It is to be noted that the same reference numerals are used to denote the same portions as those in FIGS. 10A to 10C.

The thickness of each of the inversely tapered partition walls 622 is set to be larger than the total film thickness of a stacked film including a light-emitting layer, and a conductive film. When a conductive film and a stacked film including a light-emitting layer are stacked on the first substrate 601 having the structure shown in FIG. 11, they are separated into a plurality of regions that is electrically isolated from each other, so that stacked films 615R, 615G and 615B each including a light-emitting layer, and second electrodes 616 are formed as shown in FIGS. 10A to 10C. The second electrodes 616 are electrodes in stripe form that are parallel to each other and extend along a direction intersecting with the first electrodes 613. It is to be noted that the stacked films each including a light-emitting layer and the conductive films are also formed on the inversely tapered partition walls 622; however, they are separated from the stacked films 615R, 615G and 615B each including a light-emitting layer and the second electrodes 616.

This embodiment mode describes an example in which the stacked films 615R, 615G and 615B each including a light-emitting layer are selectively formed to form a light-emitting device capable of performing full color display, from which three kinds of light emission (R, G, and B) can be obtained. The stacked films 615R, 615G and 615B each including a light-emitting layer are formed into a pattern of stripes parallel to each other.

In this embodiment, stacked films each including a light-emitting layer are sequentially formed by using the second film formation chamber included in the multi-chamber manufacturing apparatus described in Embodiment 1. A first evaporation source substrate including a light-emitting layer from which red light is obtained, a second evaporation source substrate including a light-emitting layer from which green light is obtained, and a third evaporation source substrate including a light-emitting layer from which blue light is obtained are each prepared to be transferred to the second film formation chamber of the manufacturing apparatus described in Embodiment 1. Then, a substrate provided with the first electrode 613 is also transferred to the second film formation chamber. Then, evaporation is performed by heating a surface of the first evaporation source substrate with the use of a heat source which heats a surface with the same area as the substrate or a surface with a larger area than the substrate. Subsequently, the second evaporation source substrate and the third evaporation source substrate are selectively subjected to evaporation, as appropriate. The second film formation chamber described in Embodiment 1 can prevent evaporation involving an unwanted material entering through a mask, and therefore inversely tapered partition walls 622 is not necessarily needed. Moreover, by film formation in the second film formation chamber by application of the present invention, a light-emitting layer with a desired film thickness can be obtained in which variation in film thickness is suppressed to less than 3%, and thus, color unevenness of the light-emitting device can be reduced.

Alternatively, stacked films each including a light-emitting layer which emits light of the same color may be formed over the entire surface to provide monochromatic light-emitting elements, so that a light-emitting device capable of performing monochromatic display or a light-emitting device capable of performing area color display may be provided. Still alternatively, a light-emitting device capable of performing full color display may be provided by mounting a color filter on a light-emitting device which provides white light emission.

Further, sealing may be performed using a sealant such as a sealing can or a glass substrate for sealing, if necessary. Here, a glass substrate is used as a sealing substrate, and a substrate on which a film is formed and the sealing substrate are attached to each other using an adhesive member such as a sealing member to seal a space surrounded by the adhesive member such as the sealing member. The space that is sealed is filled with a filler or a dried inert gas. Moreover, a drying agent or the like may be sealed within a space between the substrate on which a film is formed and the sealing substrate in order to improve reliability of the light-emitting device. A small amount of moisture therein is removed by the drying agent and sufficient drying is performed, and thus, reliability of a light-emitting device which is sensitive to moisture can be improved. Here, as the drying agent, a substance that absorbs moisture by chemical adsorption typified by an oxide of alkaline earth metal (calcium oxide, barium oxide, or the like) can be used. Alternatively, a substance that adsorbs moisture by physical adsorption such as zeolite or silica gel may be used as the drying agent.

The drying agent is not necessarily provided if the sealant that covers and is contact with the light-emitting element is provided to sufficiently block the outside air.

Figure 12:
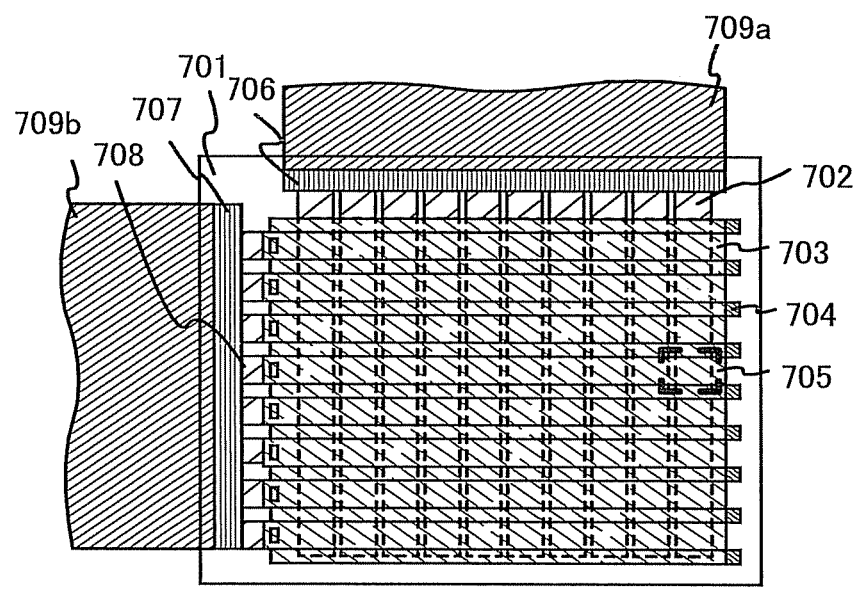
FIG. 12 is a top view of a passive-matrix light-emitting device to which the present invention is applied.

FIG. 12 is a top view of a light-emitting module mounted with an FPC or the like.

It is to be noted that the light-emitting device in this specification refers to an image display device, a light-emitting device, or a light source (including a lighting device). Further, the light-emitting device includes any of the following modules in its category: a module in which a connector such as a flexible printed circuit (FPC), a tape automated bonding (TAB) tape, or a tape carrier package (TCP) is attached to a light-emitting device; a module having a TAB tape or a TCP provided with a printed wiring board at the end thereof; and a module having an integrated circuit (IC) directly mounted over a light-emitting device by a chip on glass (COG) method.

In a pixel portion for displaying images, scanning lines and data lines intersect with each other perpendicularly as illustrated in FIG. 12.

The first electrodes 613 in FIGS. 10A to 10C correspond to scanning lines 703 in FIG. 12, the second electrodes 616 correspond to data lines 702, and the inversely tapered partition walls 622 correspond to partition walls 704. Light-emitting layers are interposed between the data lines 702 and the scanning lines 703, and an intersection portion indicated by a region 705 corresponds to one pixel.

It is to be noted that the scanning lines 703 are electrically connected at their ends to connection wirings 708, and the connection wirings 708 are connected to an FPC 709b through an input terminal 707. The data lines are connected to an FPC 709a through an input terminal 706.

If necessary, a polarizing plate, a circularly polarizing plate (including an elliptically polarizing plate), a retardation plate (a quarter-wave plate or a half-wave plate), or an optical film such as a color filter may be appropriately provided over a light-emitting surface. Further, the polarizing plate or the circularly polarizing plate may be provided with an antireflection film. For example, anti-glare treatment may be carried out by which reflected light can be diffused by projections and depressions on a surface so as to reduce reflection.

As described above, a passive-matrix light-emitting device can be manufactured.

Although FIG. 12 illustrates an example in which a driver circuit is not provided over a substrate, an IC chip including a driver circuit may be mounted as described below.

When the IC chip is mounted, a data line side IC and a scanning line side IC, in each of which the driver circuit for transmitting a signal to a pixel portion is formed, are mounted on the periphery of (outside) the pixel portion by a COG method. The mounting may be performed using a TCP or a wire bonding method other than the COG method. The TCP is a TAB tape mounted with the IC, and the TAB tape is connected to a wiring over an element formation substrate to mount the IC. Each of the data line side IC and the scanning line side IC may be formed using a transistor formed on a silicon substrate or a TFT formed over a glass substrate, a quartz substrate, or a plastic substrate. Further, a plurality of ICs which is obtained by division may be provided on one side.

This embodiment can be implemented by being freely combined with the content described in any of Embodiment Modes 1 to 3 and other embodiments as appropriate.
Embodiment 3

This embodiment describes an example of a method for manufacturing an active-matrix light-emitting device, to which the present invention is applied, with reference to the drawings.

FIG. 13A is a top view of a light-emitting device, and FIG. 13B is a cross-sectional view taken along a chain line A-A' in FIG. 13A. An element substrate 810 of the light-emitting device includes a source side driver circuit portion 801, a pixel portion 802, a gate side driver circuit portion 803, a sealing substrate 804, a sealing member 805, and an FPC 809. An inner side region surrounded by the sealing member 805 corresponds to a space 807. The element substrate 810 corresponds to a substrate on which a film is formed.

A wiring 808 transmits a signal inputted to the source side driver circuit portion 801 and the gate side driver circuit portion 803 and receives a video signal, a clock signal, a start signal, a reset signal, and the like from an FPC 809 that is to be an external input terminal. Although only the FPC is shown here, a printed wiring board (PWB) may be attached to the FPC. The light-emitting device in this specification includes, in its category, not only the light-emitting device itself but also the light-emitting device provided with the FPC or the PWB.

Next, a cross-sectional structure of the light-emitting device will be described with reference to FIG. 13B. A driver circuit portion and a pixel portion are formed over an element substrate 810. Here, a source side driver circuit portion 801 that is a driver circuit portion and a pixel portion 802 are shown here.

The source side driver circuit portion 801 includes a CMOS circuit in which an n-channel TFT 823 and a p-channel TFT 824 are combined. A known CMOS circuit may be used for the CMOS circuit. A circuit included in the driver circuit may be a PMOS circuit or NMOS circuit. In this embodiment, a driver-integrated type in which a driver circuit is formed over a substrate is described; however, the present invention is not limited to this, and the driver circuit can be formed outside the substrate.

The pixel portion 802 includes a plurality of pixels each including a switching TFT 811, a current control TFT 812, and an electrode 813 that is electrically connected to a drain of the current control TFT 812. An insulating layer 814 is formed so as to cover an edge portion of the electrode 813. Here, the insulating layer 814 is formed using a positive type photosensitive acrylic resin film.

The insulating layer 814 is formed so as to have a curved surface having curvature at an upper and lower end portions thereof in order to obtain favorable coverage of the insulating layer 814 with a film. For example, when a positive type photosensitive acrylic is used as a material for the insulating layer 814, a curved surface in which a radius of curvature is 0.2 to 3 μm is preferably formed at the upper end portion of the insulating layer 814. For the insulating layer 814, either a negative type that becomes insoluble in an etchant by photosensitive light or a positive type that becomes soluble in an etchant by light can be used, and further, the material of the insulating layer 814 is not limited to an organic compound but an inorganic compound, for example, silicon oxide, silicon oxynitride, or the like can be used.

A light-emitting element 815 and an electrode 816 are formed over the electrode 813. Here, as a material used for the electrode 813, a material having a high work function is preferable. For example, the following structures can be given: one-layer film of an indium tin oxide (ITO) film, an indium tin silicon oxide (ITSO) film, an indium zinc oxide (IZO) film, a titanium nitride film, a chromium film, a tungsten film, a zinc film, a platinum (Pt) film, or the like; a stacked film of a titanium nitride film and a film containing aluminum as its main component; a stacked film of a titanium nitride film, a film containing aluminum as its main component, and a titanium nitride film; and the like. Resistance as the wiring is low, a favorable ohmic contact with an ITO film can be formed, and further, the electrode 813 can be made to serve as an anode in a case where the electrode 813 is formed of the ITO film and a wiring of the current control TFT 812 connected to the electrode 813 has a stacked film of a titanium nitride film and a film containing aluminum as its main component or a stacked film of a titanium nitride film, a film containing aluminum as its main component, and a titanium nitride film. The electrode 813 may be formed using the same material as a first anode in the light-emitting element 815. The electrode 813 may be formed in contact with the first anode in the light-emitting element 1715.

The light-emitting element 815 has a structure in which the electrode 813, a layer 800 containing an organic compound, and the electrode 816 are stacked; specifically, the light-emitting element 815 is formed by stacking a hole injecting layer, a hole transporting layer, a light-emitting layer, an electron transporting layer, an electron injecting layer, or the like, as appropriate. In this embodiment, these layers are formed using the manufacturing apparatus described in Embodiment 1. According to the present invention, variation in film thickness is less than 3%. Therefore, a film can be formed to a desired film thickness which is excellent in uniformity, and accordingly, variation of luminance of the light-emitting device can be reduced.

As a material for the electrode 816, a material having a low work function such as aluminum, silver, lithium, or calcium; MgAg, MgIn, AlLi, $CaF_2$, or calcium nitride which is an alloy of the metal; or the like may be used. However, the material for the electrode 816 is not limited to the above, and various conductive films can be used by selection of an appropriate electron injecting material. When light emitted in the light-emitting element 815 is made to be transmitted through the electrode 816, for the electrode 816, a stacked layer of a metal thin film with a reduced film thickness and, as a transparent conductive film, an indium tin oxide (ITO) film, an indium tin silicon oxide (ITSO) film, an indium oxide zinc oxide (ZnO) film, or a zinc oxide film. The electrode 816 may be formed using the same material as a second cathode which is a cathode in the light-emitting element 815. The electrode 816 may be stacked in contact with the second cathode in the light-emitting element 815.

Further, a structure is obtained in which the light-emitting element 815 is provided in the space 807 surrounded by the element substrate 810, the sealing substrate 804, and the sealing member 805 by attaching the sealing substrate 804 to the element substrate 810 by using the sealing member 805. The space 807 may be filled with an inert gas (e.g., nitrogen or argon) or with the sealing member 805.

An epoxy-based resin is preferably used for the sealing member 805. A material used for these is preferably a material which does not transmit moisture or oxygen as possible. As the sealing substrate 804, a plastic substrate made of fiberglass-reinforced plastics (FRP), polyvinyl fluoride (PVF), polyester, acrylic, or the like can be used besides a glass substrate or a quartz substrate.

As described above, the active-matrix light-emitting device can be manufactured by applying the present invention. The manufacturing cost per substrate is high in the case of an active-matrix light-emitting device because a TFT is included; however, by applying the present invention, the manufacturing cost can be reduced. Further, by using the manufacturing apparatus described in Embodiment 1 and using a large-area substrate as the substrate, film formation process time per substrate can be largely reduced and thus cost for one light-emitting device can be drastically reduced. Therefore, it can be said that it is much effective to manufacture an active-matrix light-emitting device by using the manufacturing apparatus described in Embodiment 1 according to the method for forming a film of the present invention.

It is to be noted that the light-emitting device described in this embodiment may be mounted with a color conversion film such as a color filter as needed.

This embodiment can be implemented by being freely combined with the content described in any of Embodiment Modes 1 to 3 and other embodiments.

Embodiment 4

This embodiment describes a result of film formation performed by the method described in Embodiment Mode 1.

A 50 mm square copper substrate was used for an evaporation source substrate. A binder material layer including an evaporation material was formed over the copper substrate by a spin coating method. As a solution used for a spin coating method, a solution in which 0.3 g of PVK and 0.04 g of Alq were dissolved in 10 g of chloroform was used. The solution was dropped over the copper substrate and a process was performed at 150 rpm for 3 seconds and at 1500 rpm for 30 seconds, so that film formation was performed. With such a process, a binder material layer including an evaporation material could be formed to a thickness of approximately 2 to 3 μm.

The evaporation source substrate over which the binder material layer including an evaporation material had been formed was set in the film formation chamber shown in FIG. 2A, and a substrate on which a film is formed was placed in a position 2 mm upper than a surface of the binder material including an evaporation material. Here, a glass substrate was used as the substrate on which a film is fog med.

The evaporation source substrate and the substrate on which a film is formed were placed as described above. Heating was performed until the heat source is heated to be 400° C., and the temperature was kept at 400° C. for 30 minutes. With the above-described process, Alq in the binder material layer over the evaporation source substrate was evaporated or sublimated, and thus, a film including Alq could be formed on the substrate on which a film is formed. A film including Alq which was formed on the substrate on which a film is formed was about 60 mm square.

A film thickness of the film including Alq which had been formed on a substrate on which a film is formed as described above was measured. The measurement was performed at a center and two diagonal points (three points in total) of the film including Alq, and a distance between the center and each diagonal point was 30 mm. Film thicknesses at the points where the measurement was performed were 105.4 nm, 101.8 nm, and 104.0 nm, and film thickness distribution was ±1.7%. As described above, film thickness distribution of the film including Alq which had been formed by applying the present invention was suppressed to less than 3%.

Further, PL (photoluminescence) emission after the film including Alq was evaporated on the substrate on which a film is formed was checked. PL emission of the substrate on which a film is formed was green and PL emission of the evaporation source substrate was blue. Accordingly, it could be confirmed that an evaporation material layer was formed over the substrate on which a film is formed without remaining Alq which is an evaporation material in the binder material layer.

Embodiment 5

This embodiment describes a result of film formation by the method described in Embodiment Mode 1, which is different from that of Embodiment 4.

A 50 mm square copper substrate was used for an evaporation source substrate. A binder material layer including an evaporation material was formed over the copper substrate by a spin coating method. As a solution used for a spin coating method, a solution in which 0.3 g of PVK and 0.04 g of NPB were dissolved in 10 g of chloroform was used. The solution was dropped over the copper substrate, and a process was performed at 150 rpm for 3 seconds and at 1500 rpm for 30 seconds, so that film formation was performed. With such a process, a binder material layer including an evaporation material could be formed to a thickness of approximately 2 to 3 μm.

The evaporation source substrate over which the binder material layer including an evaporation material had been formed was set in the film formation chamber shown in FIG. 2A, and a substrate on which a film is formed was placed in a position 2 mm upper than a surface of the binder material including an evaporation material. Here, a glass substrate was used as the substrate on which a film is formed.

The evaporation source substrate and the substrate on which a film is formed were placed as described above. Heating was performed until the heat source is heated to 400° C., and the temperature was kept at 400° C. for 30 minutes. With the above-described process, NPB in the binder material layer over the evaporation source substrate was evaporated or sublimated, and thus, a film including NPB could be formed on the substrate on which a film is formed. A film including NPB which was formed on the substrate on which a film is formed was about 100 mm square.

The film thickness of the film including NPB which had been formed on a substrate on which a film is formed as described above was measured. The measurement was performed at a center and two diagonal points of the film including NPB, and a distance between the center and each diagonal point was 30 mm. As described above, film thickness distribution of the film including NPB was suppressed to less than 3%.

Further, PL (photoluminescence) emission after the film including NPB was evaporated on the substrate on which a film is formed was checked. PL emission of the substrate on which a film is formed was blue. Since PVK has molecular weight higher than NPB, it is considered that a film formed on the substrate on which a film is formed is a film including NPB.

As described above, the present invention can be applied not only to formation of a film including Alq but also to formation of a film including NPB.

Embodiment 6

This embodiment describes various electric appliances manufactured using a light-emitting device including a light-emitting element which is manufactured by applying the present invention, with reference to FIGS. 14A to 14E.

Examples of the electric appliances each including a light-emitting device which is manufactured by applying the present invention include: televisions, cameras such as video cameras or digital cameras, goggle displays (head mount displays), navigation systems, audio reproducing devices (e.g., car audio component stereos and audio component stereos), notebook personal computers, game machines, portable information terminals (e.g., mobile computers, mobile phones, portable game machines, and electronic books), and image reproducing devices provided with recording media (specifically, the devices that can reproduce a recording medium such as a digital versatile disc (DVD) and is provided with a display device capable of displaying the reproduced images), lighting equipment, and the like. Specific examples of these electronic appliances are illustrated in FIGS. 14A to 14E.

Figure 14A:
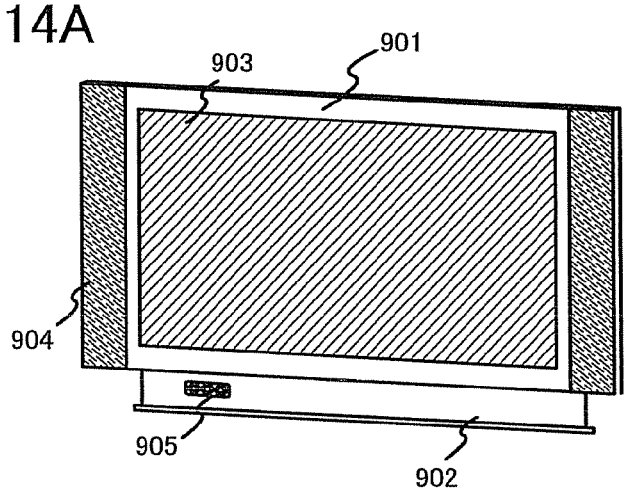
FIGS. 14A to 14E are views each showing an example of an electric appliance mounted with a light-emitting device manufactured by applying the present invention.

FIG. 14A illustrates a display device including a chassis 901, a supporting base 902, a display portion 903, a speaker portion 904, a video input terminal 905, and the like. The display device is manufactured by using a light-emitting device manufactured using the film formation apparatus of the present invention for the display portion 903. It is to be noted that the display device includes all devices for displaying information, for example, for a personal computer, for receiving TV broadcasting, and for displaying an advertisement. The present invention enables huge reduction in manufacturing cost to provide an inexpensive display device. Furthermore, since variation in film thickness can be suppressed to less than 3% by using the present invention, a light-emitting element with a desired film thickness can be obtained and display unevenness of the display portion 903 can be reduced.

Figure 14B:
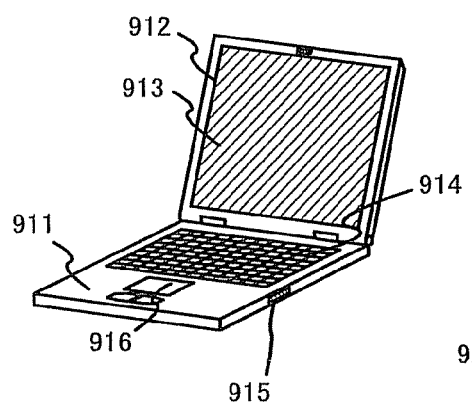

FIG. 14B illustrates a notebook personal computer including a main body 911, a chassis 912, a display portion 913, a keyboard 914, an external connection port 915, a pointing device 916, and the like. The notebook personal computer is manufactured by using a light-emitting device manufactured using the present invention for the display portion 913. The present invention enables a huge reduction in manufacturing cost to provide inexpensive notebook personal computers. Furthermore, since variation in film thickness can be suppressed to less than 3% by using the present invention, a light-emitting element with a desired film thickness can be obtained and display unevenness of the display portion 913 can be reduced.

Figure 14C:
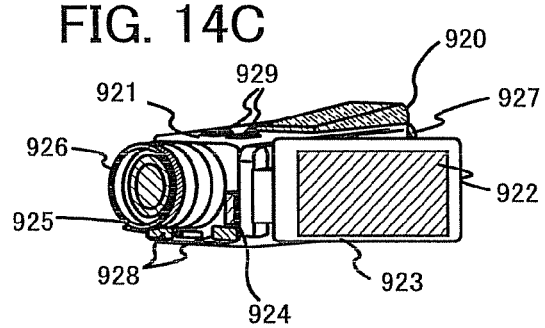

FIG. 14C illustrates a video camera including a main body 921, a display portion 922, a chassis 923, an external connection port 924, a remote control receiving portion 925, an image receiving portion 926, a battery 927, an audio input portion 928, operation keys 929, an eyepiece portion 920, and the like. The video camera is manufactured by using a light-emitting device manufactured using the present invention for the display portion 922. The film formation apparatus enables a huge reduction in manufacturing cost to provide inexpensive video cameras. Furthermore, since variation in film thickness can be suppressed to less than 3% by using the present invention, a light-emitting element with a desired film thickness can be obtained and display unevenness of the display portion 922 can be reduced.

Figure 14D:
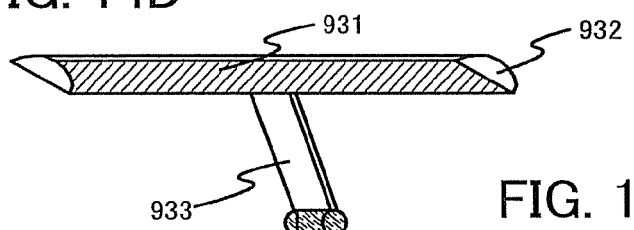

FIG. 14D illustrates a desk lamp including a lighting portion 931, a shade 932, an adjustable arm 933, a support 934, a base 935, and a power supply 936. The desk lamp is manufactured by using a light-emitting device manufactured using the film formation apparatus of the present invention for the lighting portion 931. It is to be noted that the lighting equipment includes a ceiling light, a wall light, and the like. The present invention enables a huge reduction in manufacturing cost to provide inexpensive lighting equipments. Furthermore, since variation in film thickness can be suppressed to less than 3% by using the present invention, a light-emitting element with a desired film thickness can be obtained and illuminance unevenness of the lighting portion 931 can be reduced.

Figure 14E:
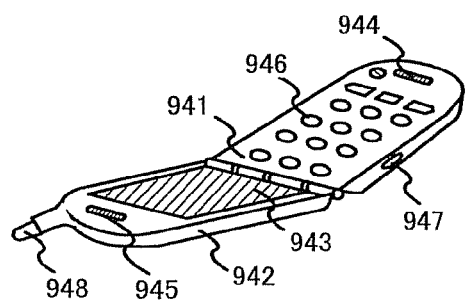

FIG. 14E illustrates a portable phone including a main body 941, a chassis 942, a display portion 943, an audio input portion 944, an audio output portion 945, operation keys 946, an external connection port 947, an antenna 948, and the like. The portable phone is manufactured by using a light-emitting device manufactured using the present invention for the display portion 943. The present invention enables a huge reduction in manufacturing cost to provide inexpensive portable phones. Furthermore, since variation in film thickness can be suppressed to less than 3% by using the present invention, a light-emitting element with a desired film thickness can be obtained and display unevenness of the display portion 943 can be reduced.

In the above-described manner, electric appliances (an electronic device, lighting equipment, or the like) using a light-emitting device manufactured using the present invention can be obtained. The applicable range of the light-emitting device manufactured using the present invention is so wide that the light-emitting device can be applied to electric appliances in various fields besides the electric appliances described here.

This embodiment can be implemented by being freely combined with the content described in any of Embodiment Modes 1 to 3 and other embodiments as appropriate.

This application is based on Japanese Patent Application serial no. 2007-119512 filed with Japan Patent Office on Apr. 27, 2007, the entire contents of which are hereby incorporated by reference.

What is claimed is:

1. A method for manufacturing a semiconductor device, comprising the steps of:
   forming a mixture of an evaporation material and a material of higher molecular weight than the evaporation material over a first substrate;
   placing a second substrate so as to have a distance less than or equal to 10 mm between the mixture and a main surface of the second substrate; and
   performing heat treatment on a rear surface of the first substrate to form a layer including the evaporation material on the main surface of the second substrate.

2. The method for manufacturing a semiconductor device, according to claim 1, wherein the heat treatment is performed at a temperature which exceeds an evaporation temperature or a sublimation temperature of the evaporation material but does not exceed 50° C. more than the evaporation temperature or the sublimation temperature of the evaporation material.

3. The method for manufacturing a semiconductor device, according to claim 1, wherein the heat treatment is performed by a heat source or a lamp.

4. The method for manufacturing a semiconductor device, according to claim 3, wherein the lamp is any one of a flash lamp, a metal halide lamp, and a halogen lamp.

5. The method for manufacturing a semiconductor device, according to claim 1, wherein the evaporation material is selected from copper phthalocyanine, 4,4'-bisbiphenyl, N,N'-bis(3-methylphenyl)-N,N'-diphenyl-4,4'-diamine, 4,4'-bis(N-{4-phenyl}-N-phenylamino)biphenyl, tris(8-quinolinolato)aluminum, tris(4-methyl-8-quinolinolato)aluminum, bis(2-methyl-8-quinolinolato)(4-phenylphenolate)aluminum, 4,4'-di(N-carbazolyl)biphenyl, 2-tert-butyl-9,10-di(2-naphthyl)anthracene, 4,4'-bis(2,2-diphenylvinyl)biphenyl, bathophenanthroline, bathocuproine, 3-(2-benzothiazole)-7-(diethylamino)coumarin, or 3-(2-benzothiazolyl)-7-(diethylamino)coumarin.

6. The method for manufacturing a semiconductor device, according to claim 1, wherein the material of higher molecular weight is selected from acrylic, polyimide, poly(N-vinylcarbazole), or poly(p-phenylenevinylene).

7. A method for manufacturing a semiconductor device, comprising the steps of:
   forming a mixture of an evaporation material and a material of higher molecular weight than the evaporation material over a first substrate;
   placing a second substrate so as to have a distance less than or equal to 10 mm between the mixture and a main surface of the second substrate;
   placing a mask between the mixture and the main surface of the second substrate; and
   performing heat treatment on a rear surface of the first substrate to form a layer including the evaporation material on the main surface of the second substrate.

8. The method for manufacturing a semiconductor device, according to claim 7, wherein the heat treatment is performed by a heat source or a lamp.

9. The method for manufacturing a semiconductor device, according to claim 8, wherein the lamp is any one of a flash lamp, a metal halide lamp, and a halogen lamp.

10. The method for manufacturing a semiconductor device, according to claim 7, wherein the evaporation material is selected from copper phthalocyanine, 4,4'-bisbiphenyl, N,N'-bis(3-methylphenyl)-N,N'-diphenyl-4,4'-diamine, 4,4'-bis(N-{4-phenyl}-N-phenylamino)biphenyl, tris(8-quinolinolato)aluminum, tris(4-methyl-8-quinolinolato)aluminum, bis(2-methyl-8-quinolinolato)(4-phenylphenolate)aluminum, 4,4'-di(N-carbazolyl)biphenyl, 2-tert-butyl-9,10-di(2-naphthyl)anthracene, 4,4'-bis(2,2-diphenylvinyl)biphenyl, bathophenanthroline, bathocuproine, 3-(2-benzothiazole)-7-(diethylamino)coumarin, or 3-(2-benzothiazolyl)-7-(diethylamino)coumarin.

11. The method for manufacturing a semiconductor device, according to claim 7, wherein the material of higher molecular weight is selected from acrylic, polyimide, poly(N-vinylcarbazole), or poly(p-phenylenevinylene).

12. A method for manufacturing a semiconductor device, comprising the steps of:
   forming a mixture of a first evaporation material, a second evaporation material and a material of higher molecular weight than the first evaporation material and the second evaporation material over a first substrate;
   placing a second substrate so as to have a distance less than or equal to 10 mm between the mixture and a main surface of the second substrate; and
   performing heat treatment on a rear surface of the first substrate to form a layer including the first evaporation material and the second evaporation material on the main surface of the second substrate.

13. The method for manufacturing a semiconductor device, according to claim 12, wherein the heat treatment is performed by a heat source or a lamp.

14. The method for manufacturing a semiconductor device, according to claim 13, wherein the lamp is any one of a flash lamp, a metal halide lamp, and a halogen lamp 15. The method for manufacturing a semiconductor device, according to claim 12, wherein the first evaporation material is selected from copper phthalocyanine, 4,4'-bisbiphenyl, N,N'-bis(3-methylphenyl)-N,N'-diphenyl-4,4'-diamine, 4,4'-bis(N-{4-phenyl}-N-phenylamino)biphenyl, tris(8-quinolinolato)aluminum, tris(4-methyl-8-quinolinolato)aluminum, bis(2-methyl-8-quinolinolato)(4-phenylphenolate)aluminum, 4,4'-di(N-carbazolyl)biphenyl, 2-tert-butyl-9,10-di(2-naphthyl)anthracene, 4,4'-bis(2,2-diphenylvinyl)biphenyl, bathophenanthroline, bathocuproine, 3-(2-benzothiazole)-7-(diethylamino)coumarin, or 3-(2-benzothiazolyl)-7-(diethylamino)coumarin.

16. The method for manufacturing a semiconductor device, according to claim 12, wherein the material of higher molecular weight is selected from acrylic, polyimide, poly(N-vinylcarbazole), or poly(p-phenylenevinylene).

* * * * *

UNITED STATES PATENT AND TRADEMARK OFFICE
CERTIFICATE OF CORRECTION

PATENT NO. : 8,734,914 B2  
APPLICATION NO. : 13/399122  
DATED : May 27, 2014  
INVENTOR(S) : Hisao Ikeda et al.

Page 1 of 1

It is certified that error appears in the above-identified patent and that said Letters Patent is hereby corrected as shown below:

In the Specification:

Column 7, line 19; Change "4,4'-[N-(1-naphthyl)" to --4,4'-bis[N-(1-naphthyl)--.

Column 15, lines 64 to 65; Change "(N-{4[N'-(3-methylphenyl)" to --(N-{4-[N'-(3-ethylphenyl)--.

Column 19, line 14; Change "present, invention" to --present invention--.

Column 19, line 39; Change "finals" to --forms--.

Column 21, line 45; Change "faulted" to --formed--.

Column 30, line 28; Change "fog med." to --formed.--.

In the Claims:

Column 34, line 45, Claim 14; Change "halogen lamp" to --halogen lamp.--.

Signed and Sealed this  
Thirtieth Day of September, 2014

Michelle K. Lee  
*Deputy Director of the United States Patent and Trademark Office*